United States Patent
Sejima

(10) Patent No.: US 10,712,393 B2
(45) Date of Patent: Jul. 14, 2020

(54) ENERGY STORAGE DEVICE MANAGEMENT APPARATUS, ENERGY STORAGE DEVICE MODULE, VEHICLE, AND ENERGY STORAGE DEVICE MANAGEMENT METHOD

(71) Applicant: GS Yuasa International Ltd., Kyoto (JP)

(72) Inventor: Kenichi Sejima, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 5 days.

(21) Appl. No.: 16/069,442

(22) PCT Filed: Jan. 13, 2017

(86) PCT No.: PCT/JP2017/000907
§ 371 (c)(1),
(2) Date: Jul. 11, 2018

(87) PCT Pub. No.: WO2017/122758
PCT Pub. Date: Jul. 20, 2017

(65) Prior Publication Data
US 2019/0025377 A1    Jan. 24, 2019

(30) Foreign Application Priority Data
Jan. 15, 2016    (JP) .................. 2016-006353

(51) Int. Cl.
*G01R 31/30* (2006.01)
*H01M 10/48* (2006.01)
(Continued)

(52) U.S. Cl.
CPC .......... *G01R 31/3842* (2019.01); *B60L 50/64* (2019.02); *B60L 50/66* (2019.02);
(Continued)

(58) Field of Classification Search
CPC ...... B60L 50/64; B60L 50/66; G01R 31/3832; G01R 31/3835; G01R 31/3842;
(Continued)

(56) References Cited

U.S. PATENT DOCUMENTS 6,366,054 B1 * 4/2002 Hoenig ................. H02J 7/0047
                                                          320/132
8,008,891 B2 * 8/2011 Yun ..................... G01R 31/3842
                                                          320/132
(Continued)

FOREIGN PATENT DOCUMENTS

CN    102472801 A    5/2012
CN    103389466 A    11/2013
(Continued)

OTHER PUBLICATIONS

International Searching Authority, International Search Report and Written Opinion for International Application No. PCT/JP2017/000907, dated Apr. 4, 2017, 8 pages, Japan Patent Office, Japan.

Primary Examiner — Tyler J Lee
(74) Attorney, Agent, or Firm — Alston & Bird LLP

(57) ABSTRACT

The present invention is to improve the estimation accuracy of an SOC of a storage element. A storage element management device disclosed in the present description is a battery management device 50 that determines an SOC range indicating a state-of-charge of a secondary battery 30, and has a constitution including a central processing unit 61 that sets an overlapping range between an SOC range (i) R1, determined by a current integration method, and an SOC range (v) R2, determined by a voltage reference method in a stage where the SOC range (i) R1 is determined by the current integration method, as a new SOC range R3.

20 Claims, 18 Drawing Sheets

(51) Int. Cl.
*B60L 50/00* (2019.01)
*G01R 31/3842* (2019.01)
*G01R 31/3835* (2019.01)
*G01R 31/3832* (2019.01)
*H01M 10/42* (2006.01)
*B60L 50/60* (2019.01)
*H01M 10/44* (2006.01)
*H02J 7/00* (2006.01)
*B60L 50/64* (2019.01)

(52) U.S. Cl.
CPC ..... *G01R 31/3832* (2019.01); *G01R 31/3835* (2019.01); *H01M 10/425* (2013.01); *H01M 10/441* (2013.01); *H01M 10/48* (2013.01); *H01M 10/482* (2013.01); *H02J 7/0021* (2013.01); *H02J 7/0047* (2013.01); *H01M 2010/4271* (2013.01); *H01M 2010/4278* (2013.01); *H01M 2220/20* (2013.01); *H02J 7/0048* (2020.01)

(58) Field of Classification Search
CPC .. H01M 10/425; H01M 10/441; H01M 10/48; H01M 10/482; H01M 2010/4271; H01M 2010/4278; H01M 2220/20; H02J 2007/005; H02J 7/0021; H02J 7/0047
See application file for complete search history.

(56) References Cited

U.S. PATENT DOCUMENTS

| | | |
|---|---|---|
| 2002/0036482 A1 | 3/2002 | Nakatsuji |
| 2006/0076929 A1* | 4/2006 | Tatsumi ............... G01R 31/367 320/132 |
| 2007/0145948 A1 | 6/2007 | Lim et al. |
| 2007/0236183 A1 | 10/2007 | Darilek |
| 2009/0001992 A1 | 1/2009 | Tsuchiya |
| 2010/0070220 A1 | 3/2010 | Darilek |
| 2010/0256936 A1 | 10/2010 | Darilek et al. |
| 2011/0257914 A1 | 10/2011 | Tsuchiya |
| 2012/0166116 A1 | 6/2012 | Yoshida et al. |
| 2012/0200257 A1* | 8/2012 | Schwarz ............... H01M 10/42 320/109 |
| 2012/0290236 A1 | 11/2012 | Majima |
| 2012/0310563 A1 | 12/2012 | Shigemizu et al. |
| 2013/0200845 A1* | 8/2013 | Bito .................... H02J 7/0042 320/109 |
| 2013/0300425 A1 | 11/2013 | Shiraishi et al. |
| 2014/0197776 A1* | 7/2014 | Schlaupitz ............... H02J 7/00 320/103 |
| 2016/0009194 A1* | 1/2016 | Katayama ............... B60L 58/14 320/109 |
| 2016/0103184 A1* | 4/2016 | Kawai ................ G01R 31/389 702/63 |
| 2017/0285109 A1* | 10/2017 | Kawamura ............. B60L 50/51 |

FOREIGN PATENT DOCUMENTS

| | | |
|---|---|---|
| IN | 1802/CHE/2012 A | 6/2013 |
| JP | 2002-058171 A | 2/2002 |
| JP | 2007-171205 A | 7/2007 |
| JP | 2007-178215 A | 7/2007 |
| JP | 2009-532678 A | 9/2009 |
| JP | 2011-169817 A | 9/2011 |
| JP | 2012-137408 A | 7/2012 |
| JP | 2012-237665 A | 12/2012 |
| JP | 2012-239290 A | 12/2012 |
| JP | 2013-057537 A | 3/2013 |
| JP | 2013-083496 A | 5/2013 |
| JP | 2013-134962 A | 7/2013 |
| JP | 2014-059206 A | 4/2014 |
| JP | 2014-060015 A | 4/2014 |
| JP | 2015-038437 A | 2/2015 |
| WO | WO 2010/140235 A1 | 12/2010 |
| WO | WO 2011/104752 A1 | 9/2011 |
| WO | WO 2012/140776 A1 | 10/2012 |
| WO | WO 2013/137141 A1 | 9/2013 |

* cited by examiner

Fig. 6

| Region | SOC region |
|---|---|
| Region I | Less than 30% |
| Region II | 30% to less than 66% |
| Region III | 66% to less than 68% |
| Region IV | 68% to less than 95% |
| Region V | 95% or more |

ENERGY STORAGE DEVICE MANAGEMENT APPARATUS, ENERGY STORAGE DEVICE MODULE, VEHICLE, AND ENERGY STORAGE DEVICE MANAGEMENT METHOD

CROSS REFERENCE TO RELATED APPLICATIONS

This application is a national stage application, filed under 35 U.S.C. § 371, of International Application No. PCT/JP2017/000907, filed Jan. 13, 2017, which claims priority to Japanese Application No. 2016-006353, filed Jan. 15, 2016, the contents of both of which as are hereby incorporated by reference in their entirety.

BACKGROUND

Technical Field

The techniques disclosed in this description relate to an energy storage device management apparatus, an energy storage device module, a vehicle, and an energy storage device management method.

Description of Related Art

Among the methods for estimating a state of charge (SOC) of an energy storage device of a secondary battery such as a lithium ion secondary battery, there are an OCV method in which an SOC is determined based on a correlation between an open circuit voltage (OCV) and an SOC of a secondary battery, and a current integration method in which an SOC is determined by integration of charging or discharging currents of an energy storage device. These techniques are disclosed in JP-A-2007-178215.

When the current integration method is used for calculating an SOC, measuring errors of a current sensor are accumulated in current integration over time, which increases an error in the SOC estimation. Therefore, when the current integration takes place for a long time, the OCV method is used for eliminating the error accumulation in the SOC estimation.

BRIEF SUMMARY

When an energy storage device has a plateau region with a small OCV variation in the SOC-OCV characteristics, an SOC estimation by the OCV method in this plateau region causes a large error in the SOC estimation. To solve this problem, it is thought that the OCV method is used only in a region with an inclination of an OCV variation in the SOC-OCV characteristics in the SOC estimation. In this case, the application of the OCV method is limited to the case with an inclination of an OCV variation, which reduces the frequency of the application of the OCV method and eventually increases a cumulative error caused by the current integration method.

This description discloses techniques for improving the SOC estimation accuracy of an energy storage device.

An energy storage device management apparatus which is disclosed in this description and determines an SOC region that indicates a state of charge of an energy storage device, includes: an information processor which determines the SOC region based on a first SOC region, which is determined by a first method, and a second SOC region, which is determined by a second method when the first SOC region is determined.

According to the techniques disclosed in this description, the SOC estimation error is reduced and the SOC estimation accuracy is improved in an energy storage device.

BRIEF DESCRIPTION OF THE FIGURES

FIG. 6 is a table showing SOC regions in the respective regions in the SOC-OCV correlation of the secondary battery.

DETAILED DESCRIPTION OF VARIOUS EMBODIMENTS

Outline of Embodiment

Figure 1:
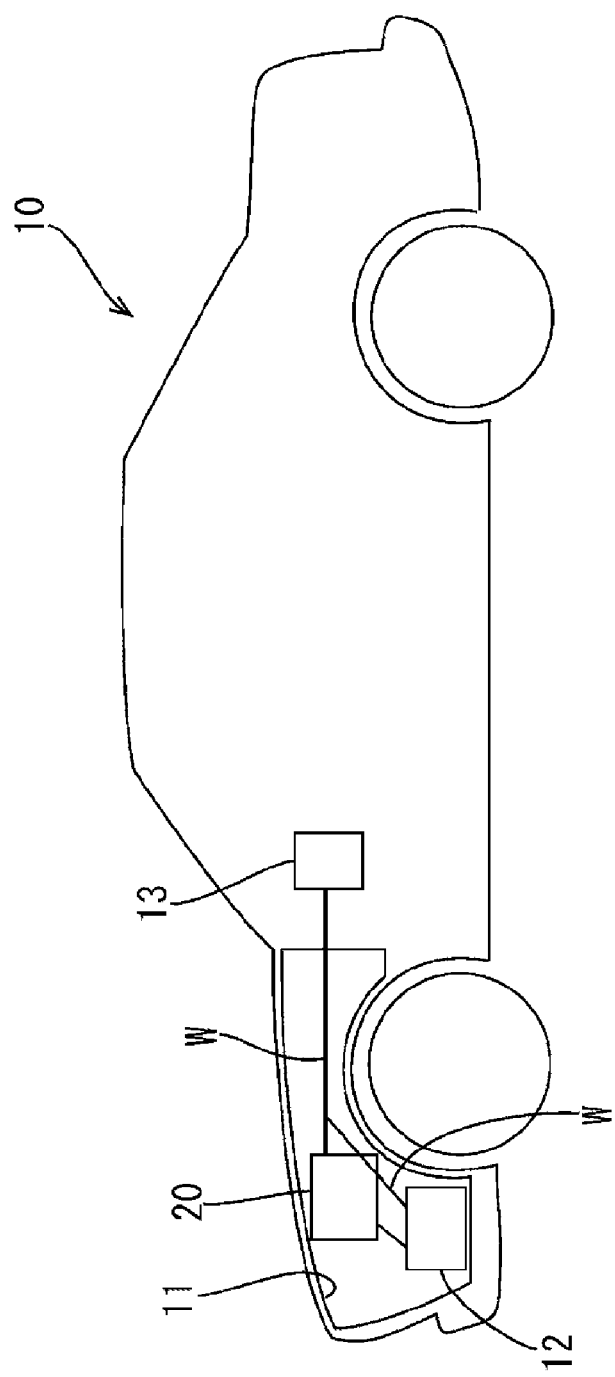
FIG. 1 is a view of an automobile.

First, the outline of an energy storage device management apparatus and an energy storage device management method disclosed through an embodiment will be explained.

An energy storage device management apparatus which is disclosed in this description and determines an SOC region that indicates a state of charge of an energy storage device, includes: an information processor which determines the SOC region based on a first SOC region, which is determined by a first method, and a second SOC region, which is determined by a second method when the first SOC region is determined.

An energy storage device module disclosed in this description includes: an energy storage device; a current measurement unit which detects a current that flows through the energy storage device; a voltage measurement unit which detects a voltage of the energy storage device; a memory which records information on a correlation between a voltage and an SOC of the energy storage device; and the energy storage device management apparatus.

A vehicle disclosed in this description includes: the energy storage device module; a vehicle load supplied with electric power from the energy storage device module; and a vehicle electronic control unit which controls the vehicle load and is capable of communicating with the energy storage device module.

An energy storage device management method which is disclosed in this description and determines an SOC estimation value that is a value indicating a state of charge of an energy storage device, includes: determining an SOC region based on a first SOC region determined by a first method and a second SOC region determined by a second SOC method.

Some energy storage devices such as lithium ion batteries have a relatively highly reproducible correlation between a voltage (V) and a state of charge (SOC). As for such an energy storage device, the correlation is stored in advance as an SOC-V correlation in the form of a table in a memory. The memory including necessary operation programs together with a CPU, for example, belong to the information processor. The information processor performs a current integration method in which an SOC of the energy storage device is determined based on the amount of charged or discharged electricity calculated by time-integration of currents detected by a current sensor, and an OCV method in which an SOC is determined based on a result detected by a voltage sensor and the SOC-V correlation. The information processor determines an estimated SOC value based on a relation between the SOC values determined by the respective methods.

When the energy storage device has a plateau region with a small OCV variation in the SOC-V correlation, an SOC estimation by the OCV method in this plateau region causes a large error in the SOC estimation. When the OCV method is applied only in a region with an inclination of an OCV variation in the SOC-V correlation, however, the frequency of the application of the OCV method is reduced.

The inventors of the present invention have given thorough consideration to the above problems. Conventionally, an SOC is determined as a specific value (such as a mean value) in an SOC region in a certain range including an error range of an instrument. The inventors, however, have tried to determine an SOC as an SOC region, that is, an SOC data range including an error range of an instrument.

The inventors have come to an idea in which an SOC region is determined based on a first SOC region determined by a first method and a second SOC region determined by a second method, and found that this makes it possible to frequently estimate an SOC region of an energy storage device having a plateau region while preventing the increase in the SOC region estimation error. The inventors have also found that this makes it possible to improve the SOC region estimation accuracy in the energy storage device.

The information processor may determine, when the first SOC region and the second SOC region overlap, an overlapped region in which the first SOC region and the second SOC region overlap as the SOC region.

According to this structure, when the first SOC region and the second SOC region overlap, the overlapped region of the first SOC region and the second SOC region is used for narrowing the SOC region and determined as the SOC region, which makes it possible to frequently estimate an SOC region while preventing the increase in the SOC region estimation error and to improve the SOC region estimation accuracy in the energy storage device.

The first method may determine the first SOC region based on a state from a previous SOC region with time of the energy storage device, the second method may determine the second SOC region based on a state of the energy storage device when the first SOC region is determined, and the second SOC region may be determined as the SOC region when the first SOC region and the second SOC region do not overlap.

According to this structure, when the first SOC region and the second SOC region do not overlap, the second SOC region determined at the time of determination of the first SOC region is determined as the SOC region. In other words, when the first SOC region and the second SOC region do not overlap, the previously determined second SOC region is determined as the SOC region, which prevents the increase in the SOC region estimation error in the energy storage device.

The first SOC region may be determined by time-integration of a current that flows through the energy storage device, and the second SOC region may be determined by an SOC-V correlation of the energy storage device and a voltage of the energy storage device.

The information processor may determine the second SOC region based on the SOC-OCV correlation, which is a correlation between an open circuit voltage and a state of charge of the energy storage device in a non-energization state.

When the first SOC region, which is determined by the first method (the current integration method) using time-integration of currents, and the second SOC region, which is determined by the second method (the OCV method) based on a voltage and the SOC-OCV correlation, overlap; the overlapped region is determined as the SOC region, which prevents the increase in the SOC region estimation error.

When the first SOC region and the second SOC region do not overlap, it is thought that the cumulative error caused by the first method (the current integration method) may problematically be large. In this case, the second SOC region previously determined by the second method (the OCV method) is determined as the SOC region, which prevents the increase in the SOC region estimation error in the energy storage device. The first SOC region is, for example, an SOC data range including an error range of a measuring instrument, a self-discharge or dark current accumulated during the time-integration of currents, and the like. The second SOC region is, for example, an SOC data range including an error of a measuring instrument and the like.

T the information processor may determine the second SOC region based on an SOC-OCV correlation of the energy storage device after being charged and an SOC-OCV correlation of the energy storage device after being discharged.

It is known that the correlation between a voltage and an SOC of the energy storage device is affected by the charge/discharge history of the energy storage device before the detection of a voltage. Specifically, an open circuit voltage relative to an SOC is lower in the case in which the current of the energy storage device has relatively been discharged than in the case in which the current of the energy storage device has relatively been charged. However, since the charge and discharge of the energy storage device are generally determined based on various factors such as current values and energization time, it is difficult to estimate the charge/discharge history. Therefore, depending on the charge/discharge history, the SOC region may be estimated as a region excluding the actual SOC region.

According to the above structure, the upper limit of the SOC region is determined based on the discharge SOC-OCV relation and the lower limit of the SOC region is determined based on the charge SOC-OCV relation, which prevents the SOC region from being determined as a region excluding the actual SOC region.

The information processor may determine the second SOC region based on a C-V correlation which is a correlation between a residual capacity and a charging voltage of the energy storage device during charge, and the information processor may determine the second SOC region as a full-charge SOC region, which is a state close to a full-charge state of the energy storage device, when a charging current is less than a predetermined current value and the charging voltage is more than a predetermined voltage value.

The information processor may determine the second SOC region as a not-full-charge SOC region, which is a region different from the full-charge SOC region, when the charging current is more than the predetermined current value and the charging voltage is less than the predetermined voltage value.

According to this structure, a charging voltage and a charging current of the energy storage device being charged are detected and it is determined whether the charging current is less than the predetermined current value and the charging voltage is more than the predetermined voltage value, which makes it easy to determine whether the second SOC region is in the full-charge SOC region. In addition, by determining whether the charging current is more than the predetermined current value and the charging voltage is less than the predetermined voltage value, it is easily determined whether the second SOC region is in the not-full-charge SOC region. This makes it possible to frequently estimate the SOC region of the energy storage device being charged and further improve the SOC region estimation accuracy.

The information processor may determine the second SOC region based on a C-V correlation which is a correlation between a residual capacity and a discharging voltage of the energy storage device during discharge, and the information processor may determine the second SOC region as a discharge-end SOC region, which is a state close to a discharge-end state of the energy storage device, when a discharging current is less than a predetermined current value and a discharging voltage is less than a predetermined voltage value.

The information processor may determine the second SOC region as a not-discharge-end SOC region, which is a region different from the discharge-end SOC region, when the discharging current is more than the predetermined current value and the discharging voltage is more than the predetermined voltage value.

According to this structure, a discharging voltage and a discharging current of the energy storage device being discharged are detected and it is determined whether the discharging current is less than the predetermined current value and the discharging voltage is less than the predetermined voltage value, which makes it easy to determine whether the second SOC region is in the discharge-end SOC region. In addition, by determining whether the discharging current is more than the predetermined current value and the discharging voltage is more than the predetermine voltage value, it is easily determined whether the second SOC region is in the not-discharge-end SOC region. This makes it possible to frequently estimate the SOC region of the energy storage device being discharged and further improve the SOC region estimation accuracy.

The information processor may section the state of charge of the energy storage device into plural SOC regions, the SOC region, of which a voltage variation relative to an SOC variation is smaller than that of another SOC region, being a small-variation region, and wherein the energy storage device is charged or discharged when the first SOC region is in the small-variation region for a predetermined time, and the second SOC region is made to be a region different from the first SOC region.

According to this structure, the energy storage device is charged or discharged on purpose, and the SOC region is shifted from the first SOC region to the second SOC region to narrow the latest SOC region, which improves the SOC region estimation accuracy.

The information processor may change the second SOC region as to be in a region different from a small-variation region in which the second SOC region currently is.

According to this structure, in order to determine the SOC region of the energy storage device, the energy storage device is charged or discharged on purpose, and the voltage is changed to enter a region different from the small-variation region to which the voltage currently belongs, which further improves the SOC region estimation accuracy.

First Embodiment

A first embodiment, which is an application of a technique disclosed in this description to a vehicle such as an automobile 10, will now be explained with reference to FIGS. 1 to 16.

As shown in FIG. 1, the automobile 10 of this embodiment includes a vehicle load 12 such as a starter motor for starting the engine or electrical equipment in an engine room 11, a battery module 20 connected to the vehicle load 12, an alternator (not shown) connected to the vehicle load 12 and the battery module 20, and a vehicle electronic control unit (ECU) 13 which controls the operation of the vehicle load 12.

The vehicle load 12 operates on electric power supplied from the battery module 20 and the alternator. When an amount of electric power supply from the alternator is small, the vehicle load 12 receives electric power supply from the battery module 20 for its operation. The alternator rotates following the operation of the engine of the automobile 10 to generate electricity and supply the electric power to the vehicle load 12 and the battery module 20.

The vehicle electronic control unit (ECU) 13 is connected to the vehicle load 12, the alternator, the battery module 20, and the like via a communication line W, and controls the operation of the engine and the vehicle load 12 based on conditions of the automobile 10 and the battery module 20.

Figure 2:
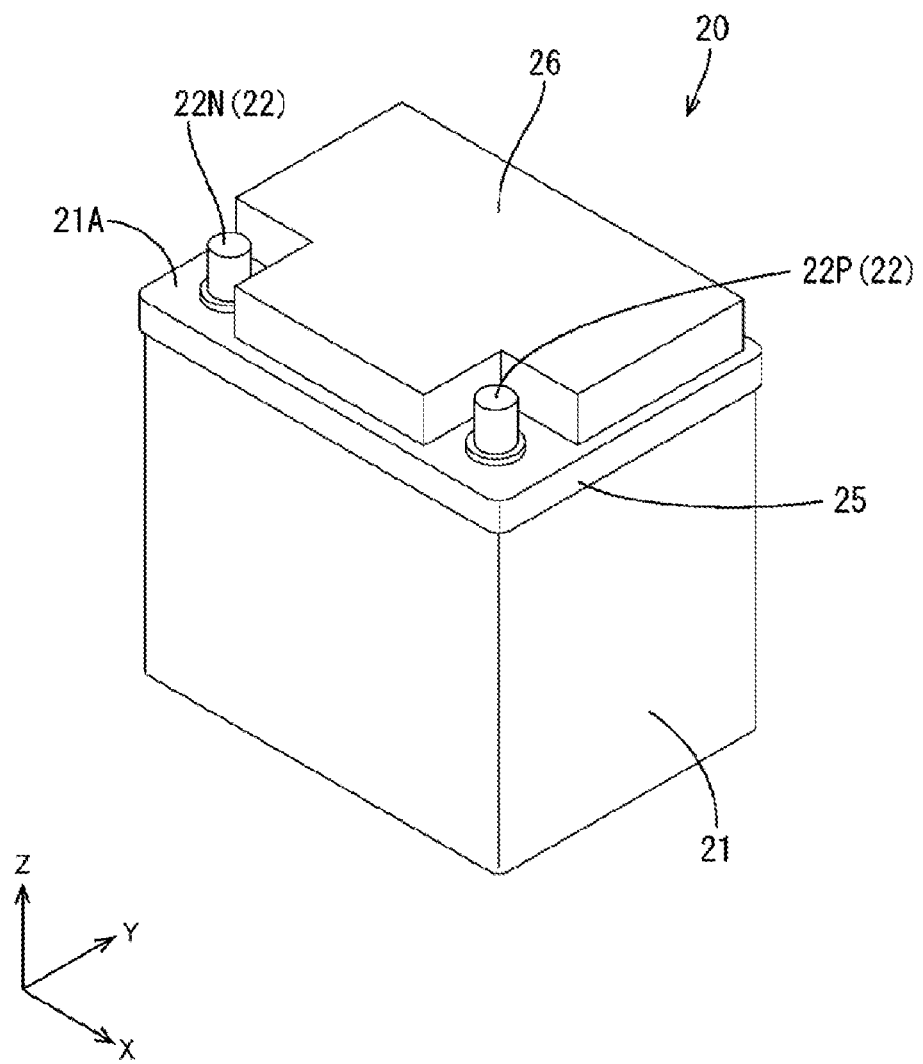
FIG. 2 is a perspective view of a battery module.
Figure 3:
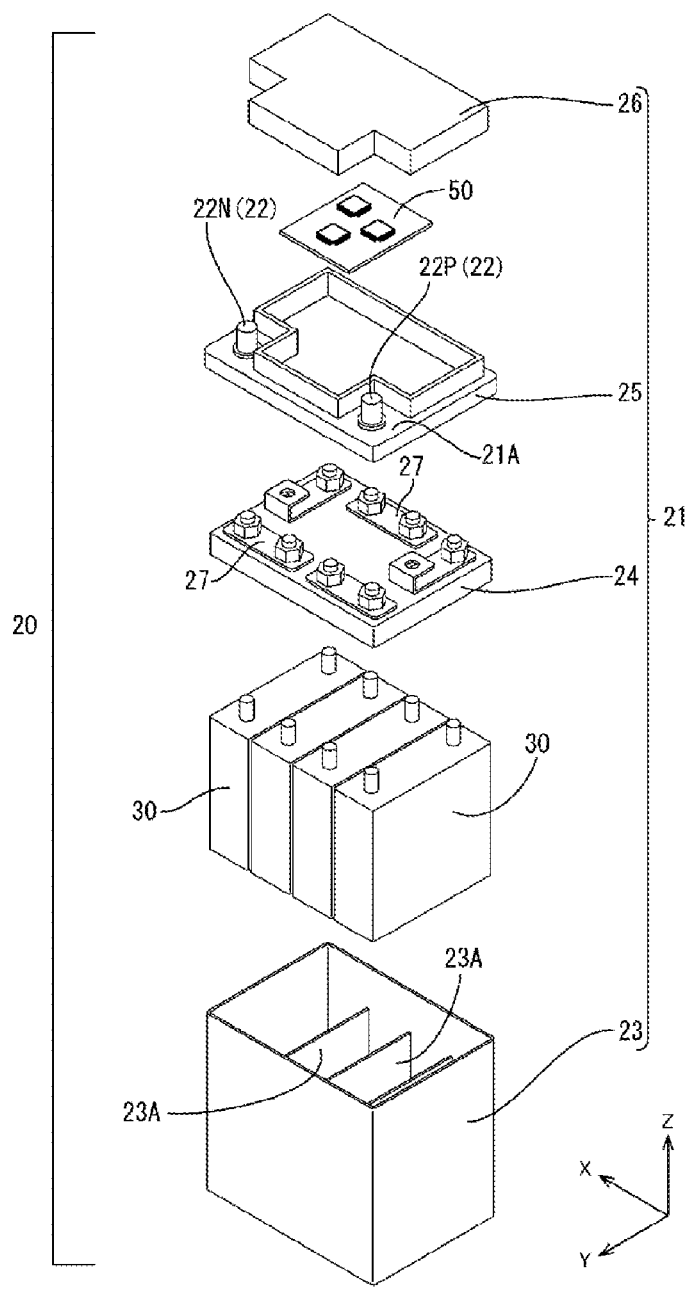
FIG. 3 is an exploded perspective view of the battery module.
Figure 4:
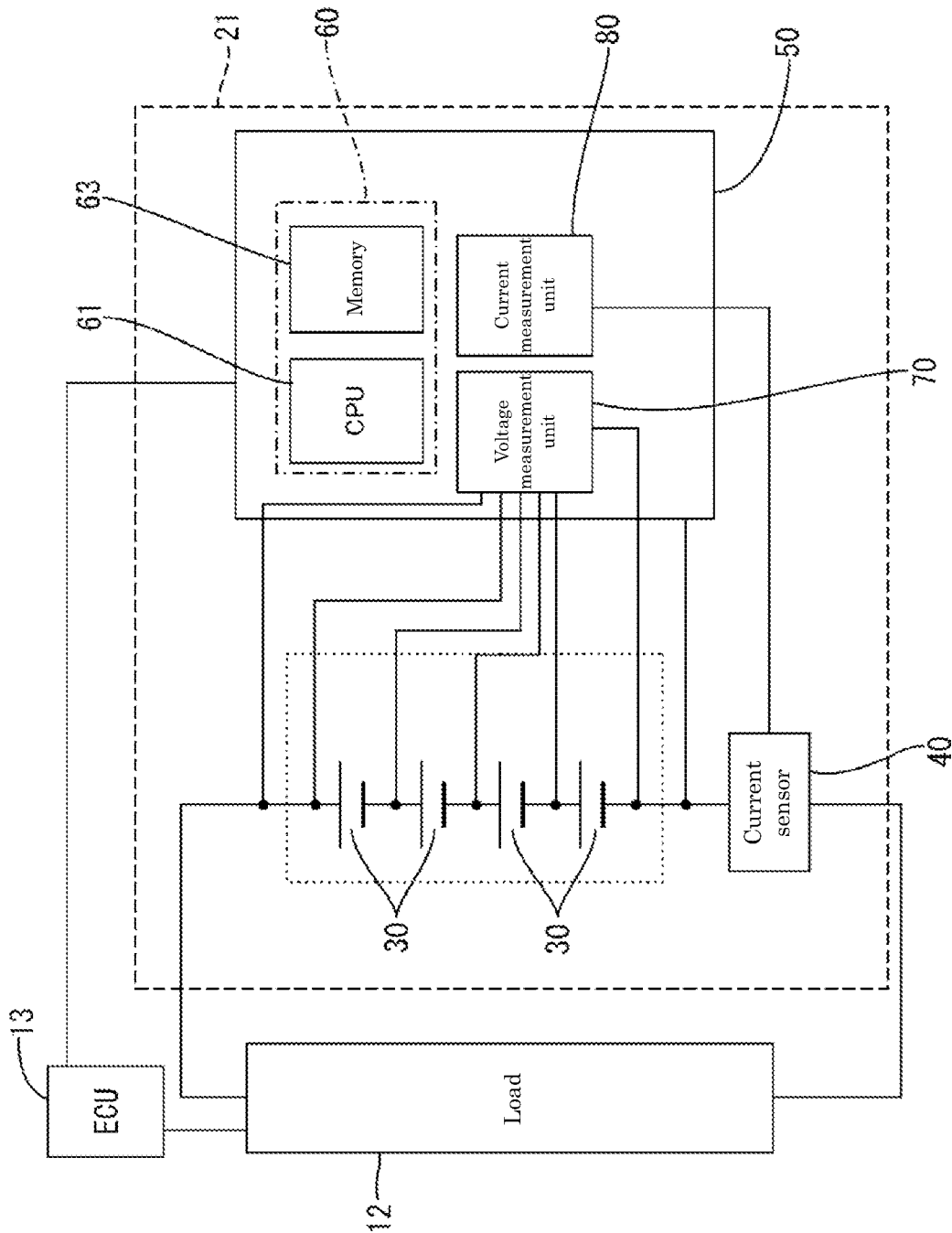
FIG. 4 is a block diagram of the battery module.

As shown in FIGS. 2 and 3, the battery module 20 includes a block-shaped battery case 21. Inside the battery case 21, as shown in FIGS. 3 and 4, there are a plurality of secondary batteries 30 connected in series (an example of the energy storage device), a battery management unit (BMU) 50 which manages these secondary batteries 30, and a current sensor 40 which detects a current through the secondary batteries 30.

The BMU 50 is an example of the energy storage device management apparatus. In FIG. 3, the current sensor 40 is omitted and the internal structure of the battery case 21 is simplified in order to show the structure of the battery case 21 in a simple way. In the following explanation with reference to FIGS. 2 and 3, the vertical direction of the battery case 21 is defined as the Y direction, the longitudinal direction of the battery case 21 is defined as the X direction, and the depth direction of the battery case 21 is defined as the Z direction when the battery case 21 is horizontally placed on an installation surface without any inclination.

The battery case 21 is made of a synthetic resin. As shown in FIGS. 2 and 3, an upper wall 21A of the battery case 21 has a substantially rectangular shape in a plane view and different heights in the Y direction. A pair of terminal parts 22 is embedded in the upper wall 21A so that harness terminals (not shown) are connected to these terminal parts 22. One terminal part 22 is at one lower corner area of the upper wall 21A and the other terminal part 22 is at the other lower corner area of the upper wall 21A in the X direction. The terminal parts 22 are made of a metal such as a lead alloy. One of the terminal parts 22 is a positive terminal part 22P and the other is a negative terminal part 22N. The lower ends of the terminal parts 22 are connected to the secondary batteries 30 in the battery case 21.

As shown in FIG. 3, the battery case 21 includes an open-top box-shaped case body 23, a positioning member 24 for determining the positions of the secondary batteries 30, an inner lid 25 disposed on the top of the case body 23, and an upper lid 26 disposed on the top of the inner lid 25.

As shown in FIG. 3, inside the case body 23, there are a plurality of cell chambers 23A disposed in the X direction. Each cell chamber 23A stores one of the secondary batteries 30.

As shown in FIG. 3, the positioning member 24 includes a plurality of bus bars 27 on the upper surface. The positioning member 24 is disposed on the top of the secondary batteries 30 in the case body 23 so that the secondary batteries 30 are disposed in place and connected in series via the bus bars 27.

As shown in FIG. 3, the inner lid 25 houses the BMU 50. The inner lid 25 is disposed on the case body 23 so that the secondary batteries 30 are connected with the BMU 50.

Figure 5:
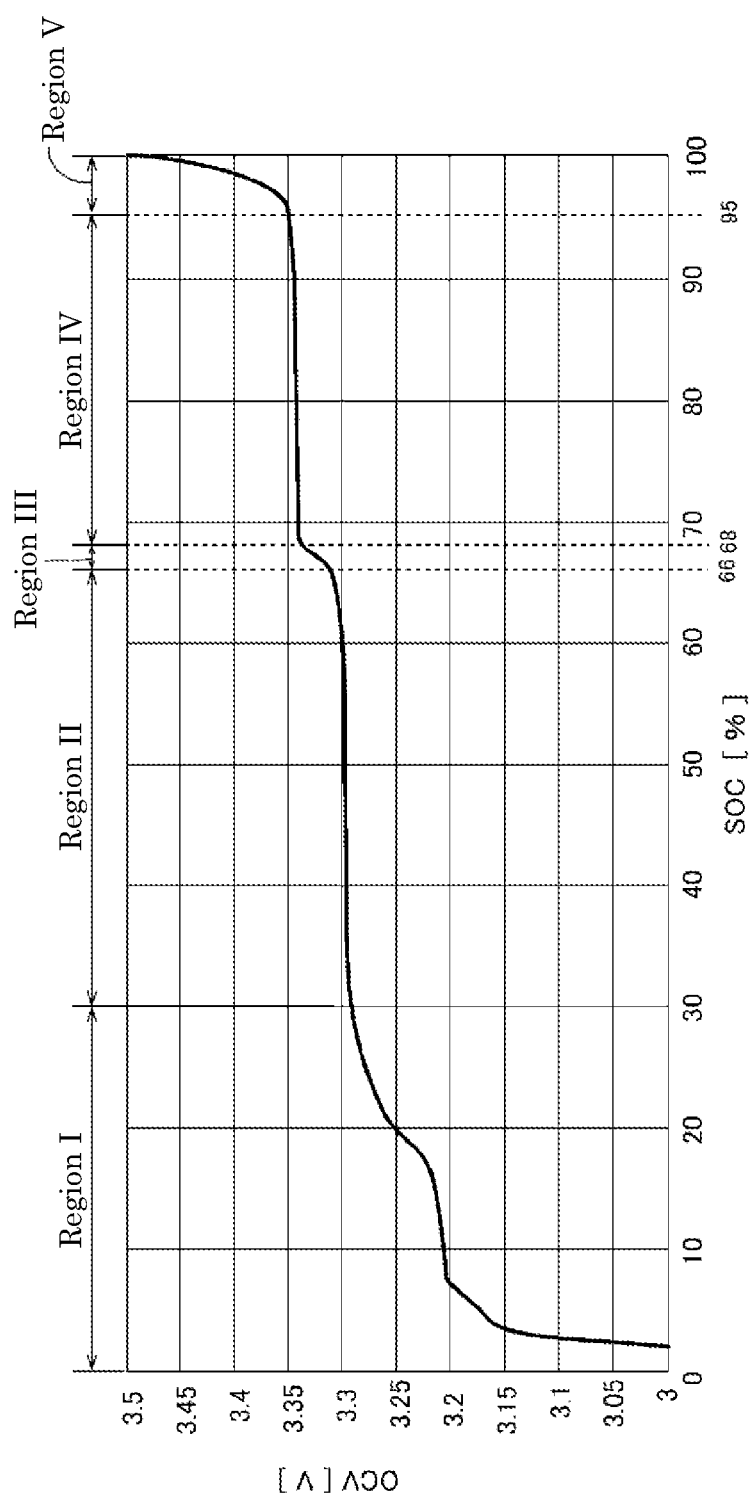
FIG. 5 is a graph showing an SOC-OCV correlation of a secondary battery.

The secondary batteries 30 are lithium ion batteries in which a graphite material is used for the negative active material and an ion phosphate material such as LiFePO4 is used for the positive active material, for example. The secondary batteries 30 has a correlation between an open circuit voltage (OCV) and a state of charge (SOC) shown in FIG. 5 (This correlation is referred to as an SOC-OCV correlation hereinafter.). As shown in FIGS. 5 and 6, the SOC-OCV correlation has the following five regions divided based on different states of charge of the secondary batteries 30.

In three regions I, III, and V of these regions, an OCV variation relative to an SOC variation of the secondary batteries 30 is a predetermined value or more and its inclination is a positive slope, that is, an OCV variation relative to an SOC variation is relatively large (These regions are referred to as inclined-voltage regions I, III, and V hereinafter.). Specifically, when an SOC varies by 1%, an OCV varies by 2 to 6 mV or more in the inclined-voltage regions, for example.

In the regions II and IV (the regions other than the inclined-voltage regions I, III, and V), an OCV variation relative to an SOC variation of the secondary batteries 30 is less than the predetermined value, that is, an OCV variation relative to an SOC variation is very small (These regions are referred to as flat-voltage regions II and IV hereinafter.). Specifically, when an SOC varies by 1%, an OCV varies by less than 2 to 6 mV in the flat-voltage regions, for example.

As shown in FIG. 4, the BMU 50 includes a control unit 60, a voltage measurement unit 70, and a current measurement unit 80. The control unit 60 includes a central processing unit (CPU) 61 as an information processer, and a memory 63. The memory 63 stores various programs for controlling the operation of the BMU 50. Based on the programs read from the memory 63, the CPU 61 performs a process for determining an SOC including a process for determining an SOC, a process using a current integration method, a process using a voltage reference method, and a process for shifting an SOC region, all of which are described below.

The memory 63 stores the data necessary for performing the process for determining an SOC, such as a table of the SOC-OCV correlation of the secondary batteries 30, the upper and lower limits of the state of charge in the respective regions I to V, and the full charge capacity of the secondary batteries 30.

The voltage measurement unit 70 is connected to both ends of each secondary battery 30 via voltage detection lines, and measures a voltage V of each secondary battery 30 in a predetermined cycle.

The current measurement unit 80 measures a current through the secondary batteries 30 via the current sensor 40.

Figure 7:
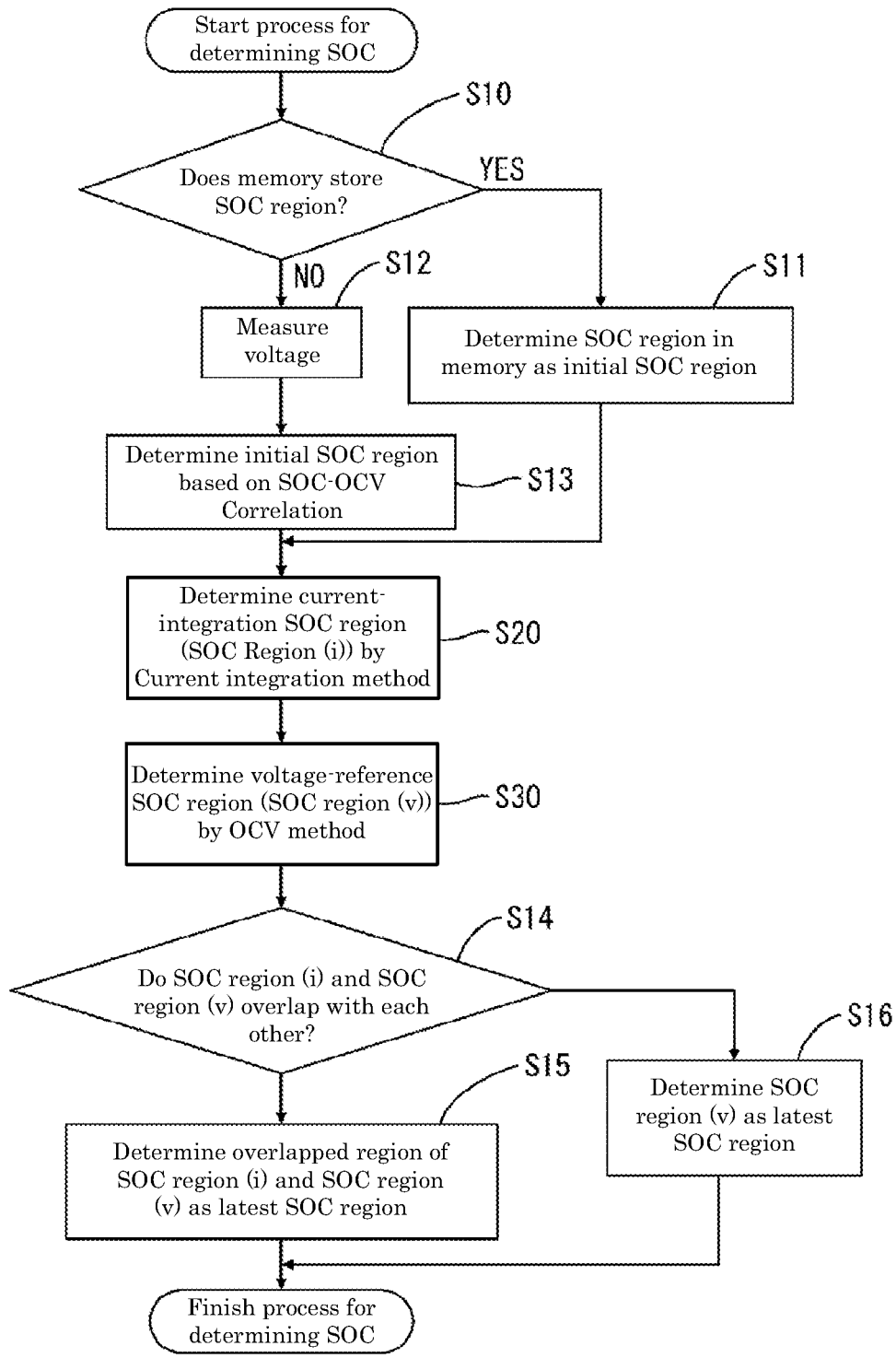
FIG. 7 is a flow chart showing a process for determining an SOC.

The process for determining an SOC of the secondary batteries 30 will now be explained with reference to FIG. 7.

The process for determining an SOC starts when the automobile 10 is started and the BMU 50 receives operation instructions from the ECU 13, for example.

After the start of the process, the control unit 60 determines an initial SOC region in a certain range including an error range of a measuring instrument and the like.

Figure 9:
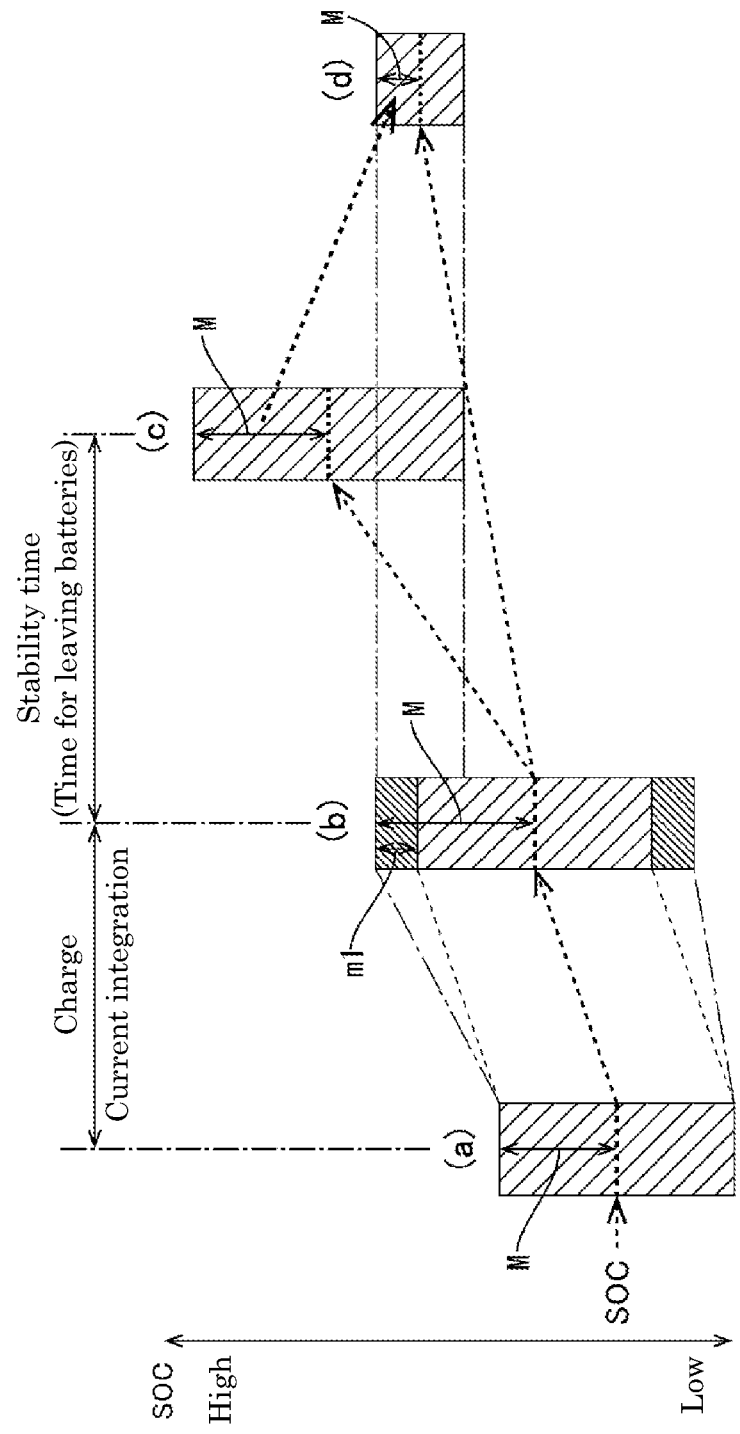
FIG. 9 is a diagram showing a process for determining an SOC region.

As shown in FIG. 9, the control unit 60 determines an SOC region (b) of the secondary batteries by a current integration method using time-integration of currents based on the initial SOC region (a), and an SOC region (c) of the secondary batteries by a voltage reference method when the SOC region (b) is determined by the current integration method. The control unit 60 then determines the overlapped region of the SOC region (b) and the SOC region (c) as the latest SOC region (d).

The control unit 60 repeats the steps to narrow the SOC regions including a cumulative error and a measuring error of an instrument, which improves the SOC region estimation accuracy.

The process for determining an SOC will be explained in detail with reference to FIGS. 7 to 9.

When determining the initial SOC region (a), the control unit 60 determines whether the memory stores the previously determined SOC region (step S10).

When the memory stores the SOC region, the control unit 60 reads the SOC region from the memory and determines the SOC region as the initial SOC region (step S11). When the memory does not store the SOC region, the control unit 60 determines the initial SOC region by the voltage reference method (the OCV method).

The process for determining the initial SOC region by the voltage reference method (the OCV method) will now be explained.

In the voltage reference method (the OCV method), the voltage measurement unit 70 measures an OCV of the secondary batteries 30 in a stable state with no charge or discharge (an OCV in a state with no current-flow) (step S12). Since the measurement by the voltage measurement unit 70 has a cell voltage measuring error, an OCV region is determined taking the cell voltage measuring error into account. The control unit 60 determines which region the OCV region is in the regions I to V in the SOC-OCV correlation shown in FIG. 5, and determines the region from the upper limit to the lower limit as an initial SOC region R0

(step S13). As shown in FIG. 9, the initial SOC region R0 is data in a certain range including an SOC estimation error M.

Figure 10:
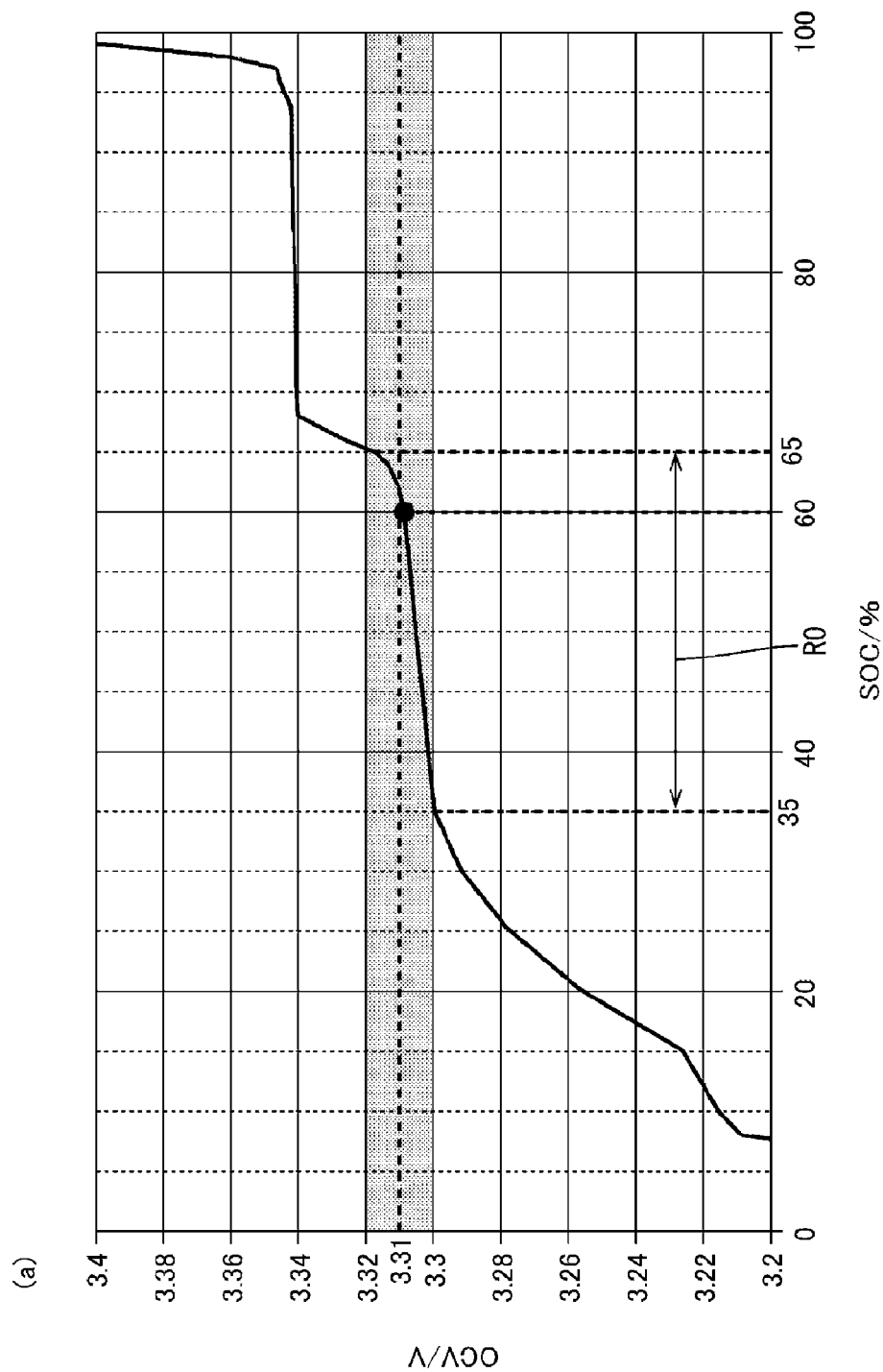
FIG. 10 is the SOC-OCV correlation in the region (a) in FIG. 9.

Specifically, as shown in FIG. 10, when the OCV of the secondary batteries 30 is 3.31 V and the cell voltage measuring error is 10 mV, for example, the upper limit of the OCV region is 3.31V+0.01V=3.32V and the lower limit of the OCV region is 3.31V−0.01V=3.3V.

With reference to the SOC-OCV correlation shown in FIG. 10 based on the upper and lower limits of the OCV region, it is determined that the lower limit of the initial SOC region R0 is 35% and the upper limit of the initial SOC region R0 is 65% (the SOC region is in the range of 35% to 65%). In this case, it is determined that the mean value of the initial SOC region R0 is 50% and the SOC estimation error is ±15%. This initial SOC region R0 corresponds to the region (a) in FIG. 9.

After determining the initial SOC region R0, the control unit 60 determines a current-integration SOC region R1 by the current integration method based on the initial SOC region R0 (step S20).

Figure 8:
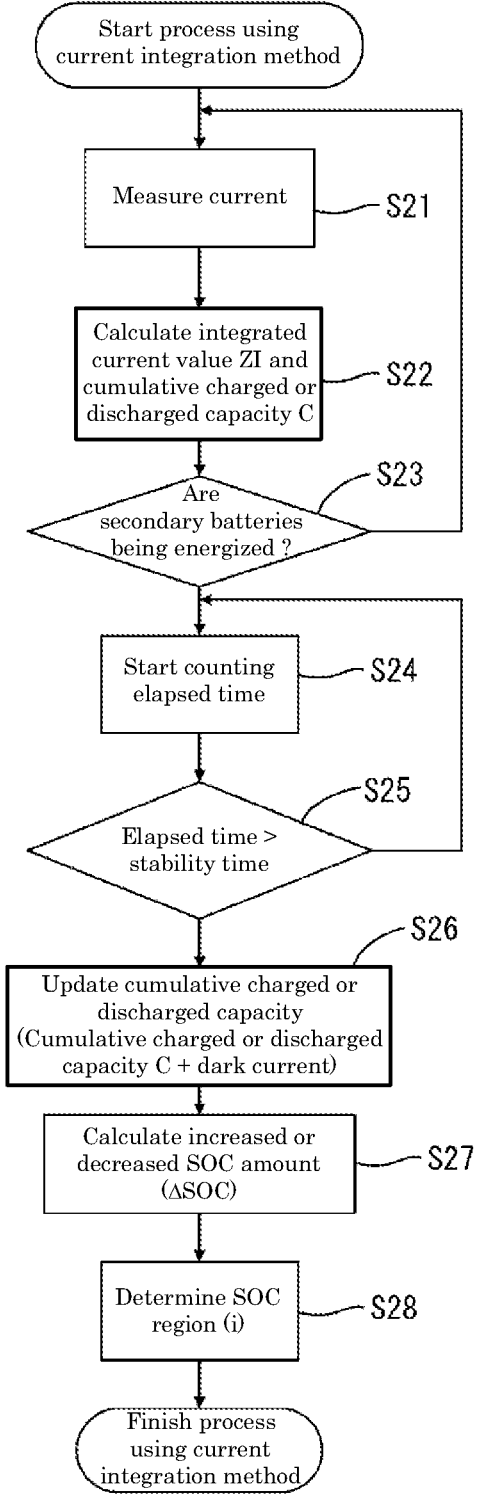
FIG. 8 is a flow chart showing a process using a current integration method.

As shown in FIG. 8, steps S21 to S23 are repeated in a predetermined cycle T in the current integration method.

In the current integration method, the control unit 60 gives instructions to the current measurement unit 80 so that the current measurement unit 80 detects a current through the secondary batteries 30 with the current sensor 40 to measure the current (step S21). The current value measured by the current measurement unit 80 is stored in the memory 63.

The control unit 60 then calculates an integrated current value ZI by multiplying the current value I measured at the current measurement unit 80 by the predetermined cycle T.

The control unit 60 then calculates a cumulative charged or discharged capacity C by addition (in the case of discharge) or subtraction (in the case of charge) of the integrated current value ZI (step S22). The cumulative charged or discharged capacity C includes a cumulative error ml caused by accumulation of errors of the current measurement unit 80.

After calculating the cumulative charged or discharged capacity C, the control unit 60 determines whether the secondary batteries 30 are being energized by discharge or charge (step S23). When the secondary batteries 30 are being energized (discharged or charged) and the current flowing through the secondary batteries is more than a predetermined value, the control unit 60 repeats steps S21 to S23 in the predetermined cycle T.

When the charge or discharge of the secondary batteries 30 stops because of the stop of the automobile 10, for example, and the current I through the secondary batteries 30 is less than a predetermined value (a value considered as substantially zero current), the control unit 60 determines that the secondary batteries 30 has no current-flow and starts to count the elapsed time (step S24).

After leaving the secondary batteries 30 for a certain time, the control unit 60 determines whether a predetermined time (a stability time) has passed (step S25). The stability time is a time necessary for the OCV of the secondary batteries 30 to become stable. The control unit 60 may adopt a predetermined time stored in the memory 63 as the stability time or determine the stability time based on the correlation between temperature and stability time stored in the memory 63.

When the elapsed time reaches the stability time, the control unit 60 adds an integrated dark current (currents integrated due to a small amount of electric power consumption by the vehicle load 12 or self-discharge) to the cumulative charged or discharged capacity C to determine the cumulative charged or discharged capacity C including the dark current as the updated cumulative charged or discharged capacity C (step S26).

After updating the cumulative charged or discharged capacity C, the control unit 60 calculates an increased or decreased SOC amount ΔSOC by dividing the cumulative charged or discharged capacity C by the full charge capacity Cf stored in the memory 63 (C/Cf=ΔSOC) (step S27), and adds the increased or decreased SOC amount ΔSOC to the initial SOC region R0 to determine the current-integration SOC region R1 by the current integration method (step S28). As shown in FIG. 9, the current-integration SOC region R1 is data in a certain range including the cumulative error ml of the current measurement unit 80 and the SOC estimation error M. The current-integration SOC region is referred to as "an SOC region (i)" hereinafter.

Figure 11:
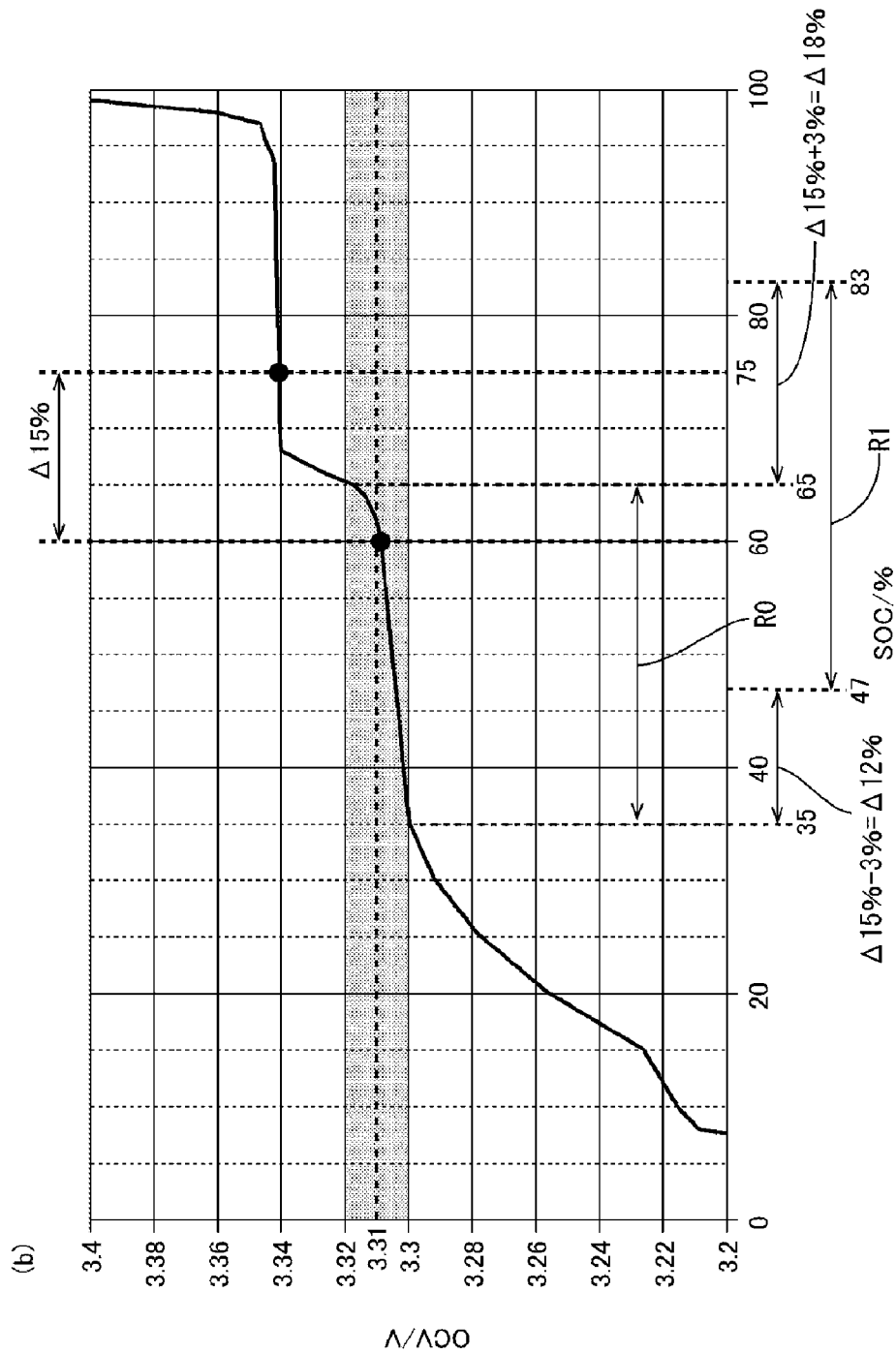
FIG. 11 is the SOC-OCV correlation in the region (b) in FIG. 9.

Specifically, as shown in FIG. 11, when the initial SOC region R0 has the lower limit of 35%, the upper limit of 65%, the mean value of 50%, and the SOC estimation error of ±15%, and when the ΔSOC calculated by the current integration method is 15% and the cumulative error caused by the current integration method is ±3%; the SOC region (i) R1 has the lower limit of 50%±3% and the upper limit of 80%±3%. Accordingly, the SOC region (i) R1 is in the range of 47% to 83% with the mean value of 65%. In this case, the SOC estimation error is ±18%. This SOC region (i) R1 corresponds to the region (b) in FIG. 9.

The control unit 60 then determines a voltage-reference SOC region R2 of the secondary batteries 30 by the voltage reference method (the OCV method) when the SOC region (i) R1 is determined (step S30).

In the voltage reference method, the control unit 60 gives instructions to the voltage measurement unit 70 so that the voltage measurement unit 70 measures an OCV of the secondary batteries 30 in a stable state with no charge or discharge, and determines the OCV region with reference to the SOC-OCV correlation shown in FIG. 5, as in the steps for determining the initial SOC region R0. The control unit 60 then determines which region the OCV region is in the regions I to V, and determines the region from the upper limit to the lower limit as the voltage-reference SOC region R2. The voltage-reference SOC region R2 is referred to as "an SOC region (v)" hereinafter.

Figure 12:
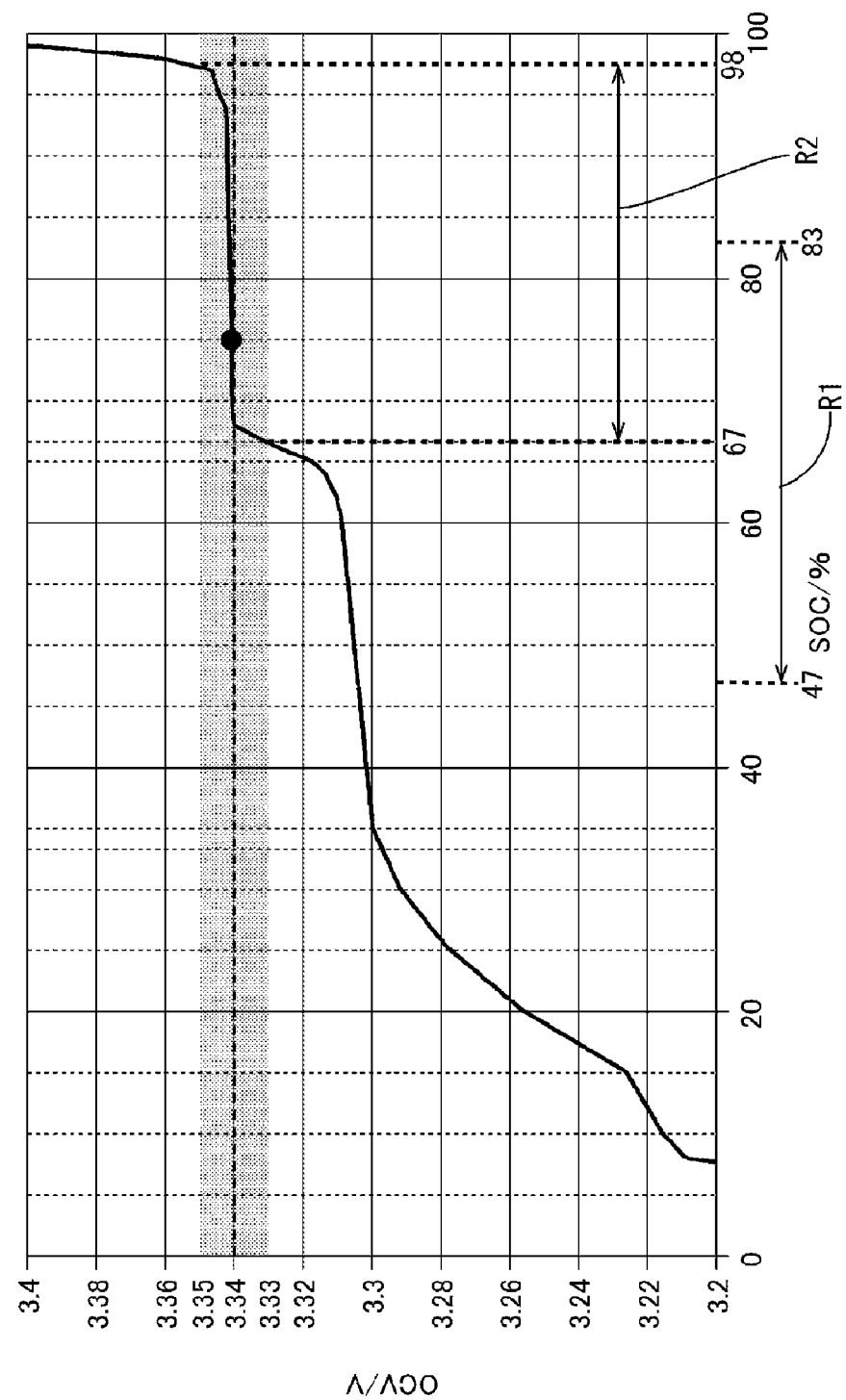
FIG. 12 is the SOC-OCV correlation in the region (c) in FIG. 9.

Specifically, as shown in FIG. 12, when the OCV of the secondary batteries 30 is 3.34 V and the cell voltage measuring error is 10 mV, for example, the upper limit of the OCV region is 3.34V+0.01V=3.35V and the lower limit of the OCV region is 3.34V−0.01V=3.33V.

With reference to the SOC-OCV correlation shown in FIG. 12 based on the upper and lower limits of the OCV region, it is determined that the SOC region (v) R2 is in the range of 67% to 98% with the mean value of 82.5% and the SOC estimation error is ±15.5%. This SOC region (v) R2 corresponds to the region (c) in FIG. 9.

After determining the SOC region (i) R1 and the SOC region (v) R2, the control unit 60 determines whether these two SOC regions overlap (step S14).

Figure 13:
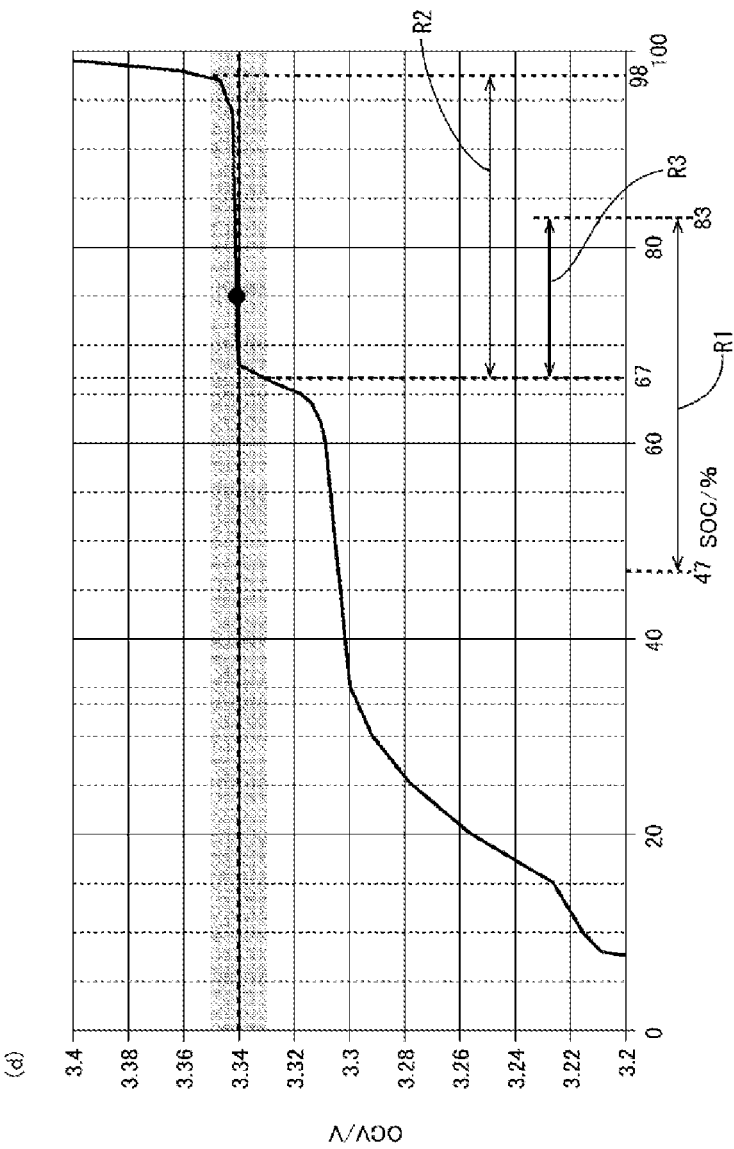
FIG. 13 is the SOC-OCV correlation in the region (d) in FIG. 9.

When the SOC region (i) R1 and the SOC region (v) R2 overlap, the control unit 60 determines the overlapped region as the latest SOC region R3 (step S15). When the SOC region (i) R1 is in the range of 47% to 83% and the SOC region (v) R2 is in the range of 67% to 98% as shown in FIG. 13; the overlapped region, that is, the latest SOC region R3 is in the range of 67% to 83% with the mean value of 75% and the estimation error is ±8% as shown in FIGS. 9 and 13. This latest SOC region R3 corresponds to the region (d) in FIG. 9.

When the SOC region (i) R1 and the SOC region (v) R2 do not overlap (due to a large cumulative error m1 caused during the current integration for determining an SOC, for example), however, the control unit 60 determines the SOC region (v) R2, which is the previously determined voltage-reference SOC region, as the latest SOC region R3 (step S16).

The control unit 60 then stores the SOC region determined in this way in the memory, and finishes the process for determining an SOC. Then, the process for determining an SOC is repeated in a predetermined cycle.

In a conventional case, the voltage reference method (the OCV method) is used for eliminating a cumulative error caused by the current integration method, however, the SOC is not determined as an SOC region in a certain range, that is, the overlapped region is not used for determining the latest SOC region. In the case simply using the voltage reference method for error elimination, the latest SOC is determined as a value of 82.5% with an estimation error of ±15.5% (31% at the maximum). According to this embodiment, however, the SOC region is in the range of 67% to 83% with the mean value of 75% and the estimation error is ±8% (16% at the maximum). In this embodiment, an SOC is determined as an SOC region in a certain range, and the overlapped region of two SOC regions determined by two different methods is determined as the latest SOC region. As a result, the SOC estimation error is generally as half as the SOC estimation error in the case simply using the voltage reference method (the OCV method) for error elimination, and the SOC estimation accuracy is substantially improved.

When the SOC region (i) R1 and the SOC region (v) R2 do not overlap (due to a large cumulative error caused during the current integration for determining an SOC), the SOC region (v) R2 is determined as the latest SOC region to eliminate the cumulative error.

In the case simply using the voltage reference method for error the elimination, the voltage reference method is applied only in the inclined-voltage regions I, III, and V. According to this embodiment, however, the voltage reference method is applied not only in the inclined-voltage regions I, III, and V but also in all the regions including the flat-voltage regions II and IV in the process for determining an SOC, which increases the frequency of the application of the voltage reference method in the process for determining an SOC and further improves the SOC estimation accuracy.

When the overlapped region of the SOC region (i) R1 and the SOC region (v) R2 is determined as the latest SOC region R3 in the process for determining an SOC, the SOC region (i) R1 calculated by the current integration method and the SOC region (v) R2 calculated by the voltage reference method may be in the same flat-voltage region in the SOC-OCV correlation. In this case, although the latest SOC region R3 can still be narrowed to a certain degree based on the SOC region (i) R1 and the SOC region (v) R2, the overlapped region becomes larger. As a result, the latest SOC region R3 also becomes larger.

Specifically, when the OCV of the secondary batteries 30 is in the flat-voltage region II in the process for determining an SOC by the current integration method, and when the amount of electricity generated by the alternator is substantially equal to the amount of electricity consumed by the vehicle load 12, for example; the SOC region keeps staying in the same flat-voltage region II for a long time.

To solve this problem, the control unit 60 shifts an SOC region in this embodiment.

Figure 14:
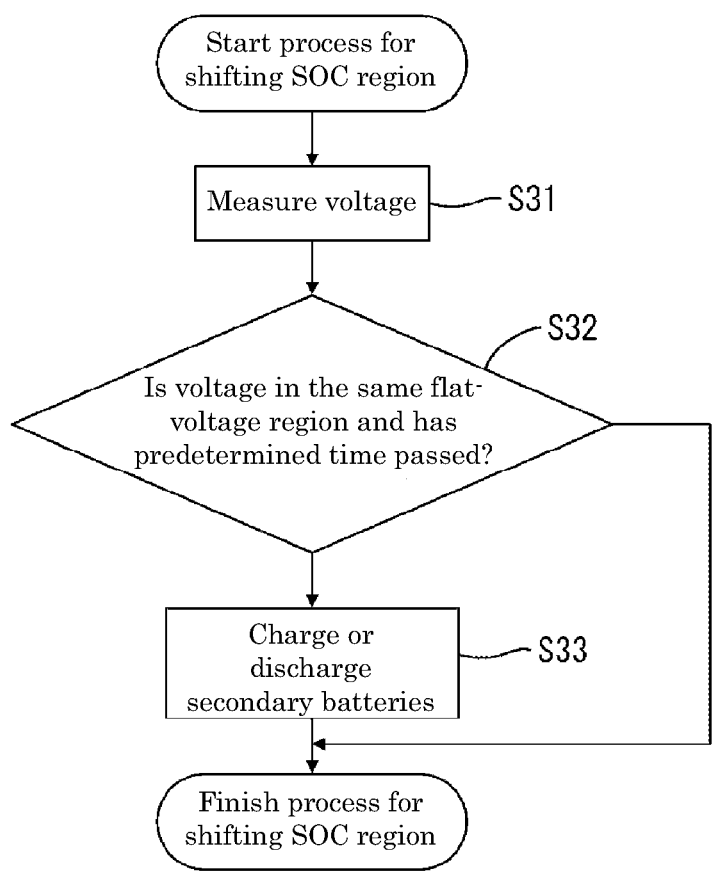
FIG. 14 is a flow chart showing a process for shifting an SOC region.

The process for shifting an SOC region will now be explained with reference to FIG. 14.

In the process for shifting an SOC region, after the SOC region (i) R1 is calculated by the current integration method and when the elapsed time from the start of the non-energization state reaches the stability time, the control unit 60 gives instructions to the voltage measurement unit 70 so that the voltage measurement unit 70 measures a voltage of each secondary battery 30 (step S31).

The control unit 60 then determines whether the voltage is in the same flat-voltage region for a predetermined time (step S32). When the SOC region (i) R1 moves from the same flat-voltage region, the control unit 60 finishes the process for shifting an SOC region.

When the SOC region (i) R1 is in the same flat-voltage region for a predetermined time, however, the control unit 60 charges or discharges the secondary batteries 30 to shift the SOC region to a region different from the flat-voltage region presently including the SOC region (step S33).

Specifically, when the OCV calculated in the process for determining an SOC by the current integration method is in the flat-voltage region II and the OCV keeps staying in the same flat-voltage region II for a predetermined time, the control unit 60 discharges the secondary batteries 30 with a discharge circuit (not shown) or charges the secondary batteries 30 with the alternator via the ECU 13.

In other words, the control unit 60 charges or discharges the secondary batteries 30 on purpose to make the voltage enter a region different from the small-variation region presently including the voltage, and then performs the voltage reference method to determine the SOC region (v) R2 based on the voltage in the different region. This further narrows the latest SOC region and further improves the SOC region estimation accuracy.

Even when the charge or discharge takes place but the voltage does not enter a different region, the SOC region (i) R1 is still shifted by the charge or discharge. Therefore, after the SOC region (i) R1 is shifted, the SOC region (i) R1 and the SOC region (v) R2 are not in the same region and the latest SOC region is narrowed due to the shift of the SOC region (i) R1. In other words, even when the voltage does not enter a different region due to the charge or discharge, the SOC region estimation accuracy is still improved.

Although there is the SOC-OCV correlation between an open circuit voltage (OCV) and a state of charge (SOC) of the secondary batteries as shown in FIG. 5, it is known that the correlation between an OCV and an SOC of the secondary batteries is affected by the charge/discharge history of the secondary batteries before the detection of an OCV.

Figure 15:
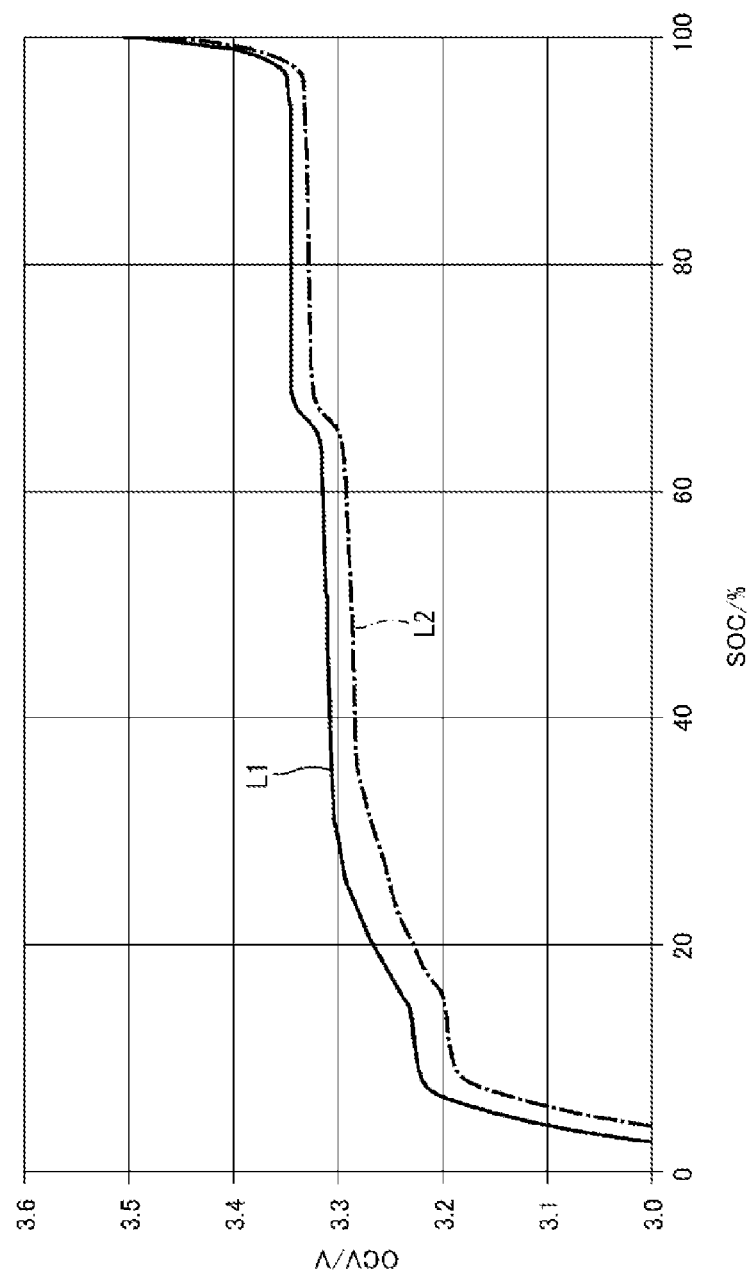
FIG. 15 is a graph showing a discharge SOC-OCV correlation of the secondary battery, and a charge SOC-OCV correlation of the secondary battery.

Specifically, as shown in FIG. 15, an SOC relative to an OCV tends to be higher in a discharge SOC-OCV correlation L2 in the case in which the current of the secondary batteries 30 has relatively been discharged than in a charge SOC-OCV correlation L1 in the case in which the current of the secondary batteries 30 has relatively been charged.

However, since the charge and discharge of the secondary batteries are generally determined based on various factors such as current values and energization time, it is difficult to estimate the charge/discharge history of a battery module in a vehicle like the battery module in this embodiment. Depending on the charge/discharge history, the SOC region may be estimated as a region excluding the actual SOC region.

Figure 16:
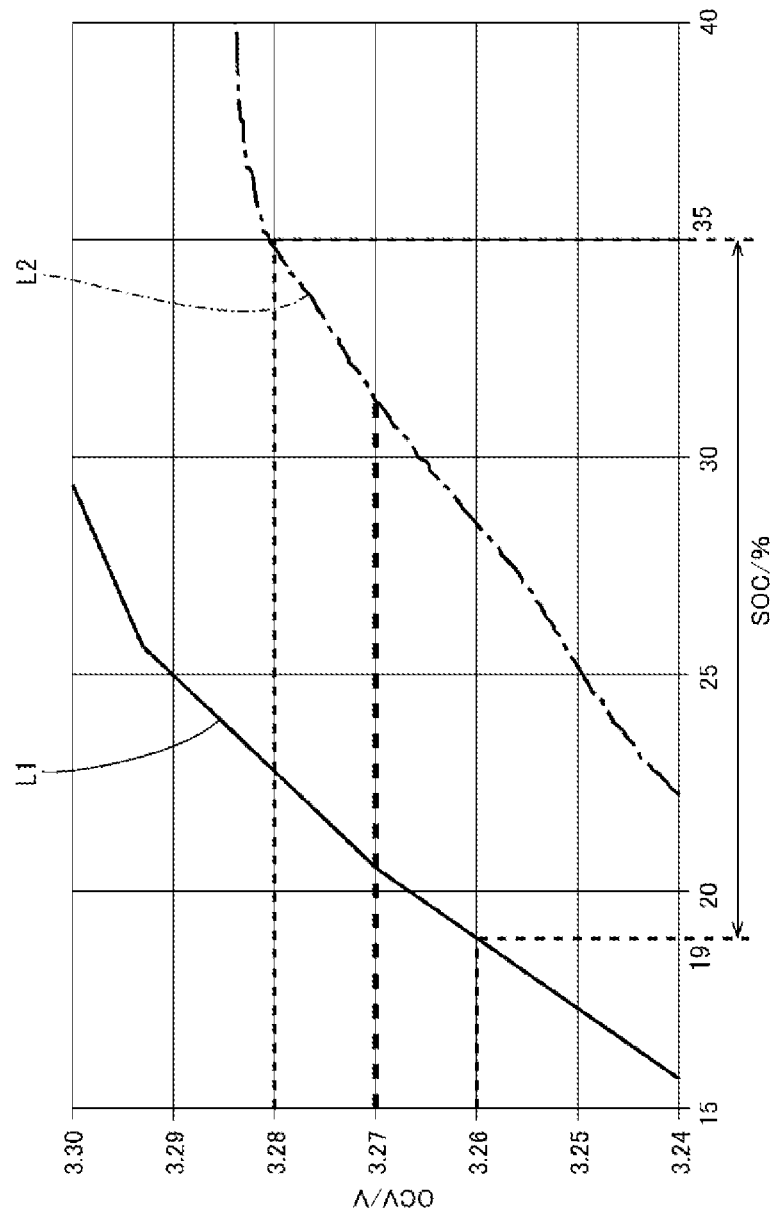
FIG. 16 is an enlarged view of a part of FIG. 15.

To solve this problem, in this embodiment, as shown in FIGS. 15 and 16, the discharge SOC-OCV correlation L2 indicating the tendency of the secondary batteries 30 toward discharge and the charge SOC-OCV correlation L1 indicating the tendency of the secondary batteries 30 toward charge are stored in the memory in advance. At the time of reference to the SOC-OCV correlation, the upper limit of an SOC region is estimated with reference to the discharge SOC-OCV correlation indicating the discharge tendency, and the lower limit of the SOC region is estimated with reference to the charge SOC-OCV correlation indicating the charge tendency.

In other words, this embodiment prevents an SOC region from being estimated as a region including values lower than the actual values when the OCV of the secondary batteries 30 have relatively been discharged. Also, this embodiment prevents an SOC region from being estimated as a region including values higher than the actual values when the OCV of the secondary batteries 30 have relatively been charged.

Specifically, as shown in FIG. 16, an OCV, which is measured by the voltage measurement unit 70 under the instructions of the control unit 60, is 3.27 V and the cell voltage measuring error is 10 mV; the upper limit of the OCV is determined as 35% with reference to the discharge SOC-OCV correlation and the lower limit of the OCV is determined as 19% with reference to the charge SOC-OCV correlation.

This embodiment prevents the SOC region from being determined as a region excluding the actual SOC region compared to the case using the SOC-OCV correlation which consists of the mean values of the discharge SOC-OCV correlation and the charge SOC-OCV correlation.

Second Embodiment

A second embodiment will now be explained with reference to FIGS. 17 and 18.

Different from the first embodiment, a voltage-reference SOC region is determined based on a voltage and a current of the secondary batteries 30 being charged or discharged in the process for determining an SOC in the second embodiment. The explanation of the structures, operations, and advantages equal to those in the first embodiment will be omitted for avoiding redundancy. The structures equal to those in the first embodiment will be provided with the same reference signs.

Figure 17:
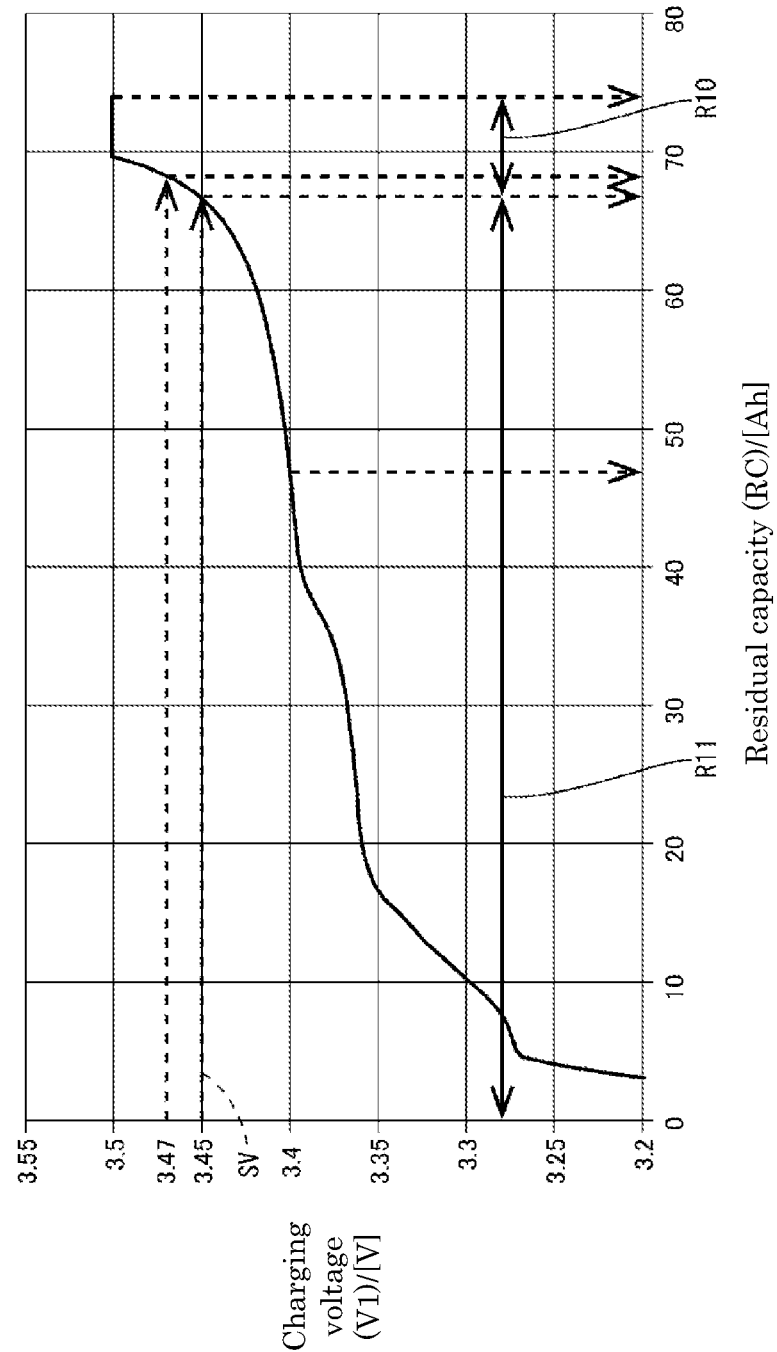
FIG. 17 is an RC-V1 correlation of the secondary battery being charged in a second embodiment.
Figure 18:
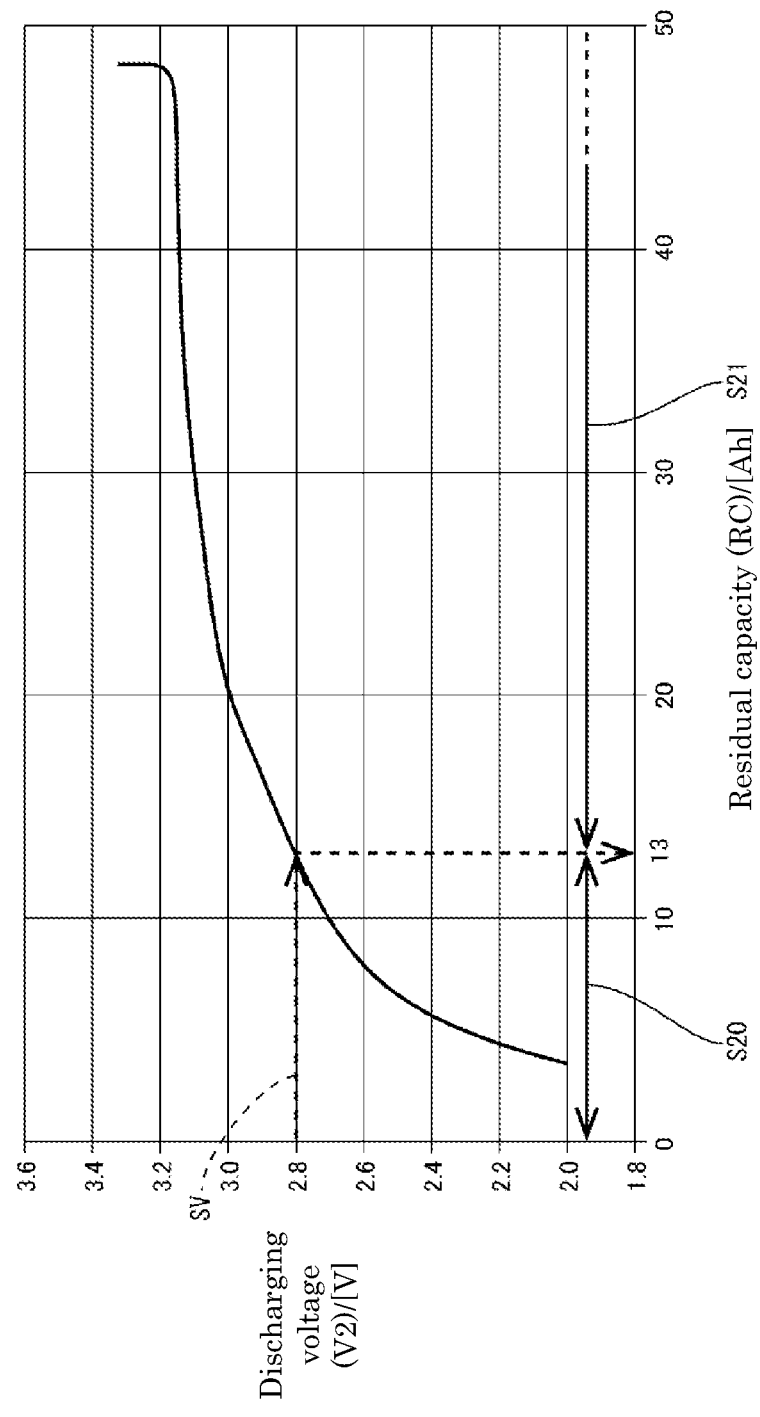
FIG. 18 is an RC-V2 correlation of the secondary battery being discharged.

The secondary batteries 30 also have a C-V correlation between a charging voltage V1 and a residual capacity RC and a C-V correlation between a discharging voltage V2 and a residual capacity RC as shown in FIGS. 17 and 18 other than the correlation between an open circuit voltage (OCV) and a state of charge (SOC) as described in the first embodiment. The residual capacity RC is an amount of electricity which can be discharged from the secondary batteries 30 until the voltage of the batteries drop to a predetermined end-of-discharge voltage. The residual capacity RC is expressed by the product of a current and a time with a unit of an ampere-hour [Ah].

The residual capacity RC of the secondary batteries 30 is determined based on a current measured by the current measurement unit 70 and a voltage under the circumstances that a current threshold and a voltage threshold are set as reference values for determining whether the state of the secondary batteries 30 is in a state close to a full-charge state in the RC-V1 correlation between the charging voltage V1 and the residual capacity RC. The SOC region of the secondary batteries 30 is then determined by dividing the residual capacity RC by the full charge capacity Cf.

The process for determining an SOC region of the secondary batteries 30 being charged will now be explained.

When the current measured by the current measurement unit 80 is less than the current threshold and the voltage measured by the voltage measurement unit 70 is more than the voltage threshold in the secondary batteries 30 being charged, it is determined that the residual capacity RC of the secondary batteries 30 is in a state close to the full-charge state and the SOC region of the secondary batteries 30 is in a full-charge SOC region.

When the current measured by the current measurement unit 80 is more than the current threshold and the voltage measured by the voltage measurement unit 70 is less than the voltage threshold in the secondary batteries 30 being charged, it is determined that the residual capacity RC of the secondary batteries 30 is not in the full-charge state and the SOC region of the secondary batteries 30 is in a not-full-charge SOC region different from the full-charge SOC region.

Specifically, as shown in FIG. 17, when the current threshold is 60 [A] and the voltage threshold SV is 3.45 [V] in the RC-V1 correlation between the charging voltage V1 and the residual capacity RC at 25° C., and when the current of the secondary batteries 30 is less than the current threshold and the voltage of the secondary batteries 30 is more than the voltage threshold; it is determined that the residual capacity RC of the secondary batteries 30 is in a state R10 within a range of approximately 8 Ah or less from the full-charge state, which is close to the full-charge state.

For example, when the current measured during charge is 58 [A] and the voltage measured during charge is 3.47 [V] (the current of the secondary batteries 30 is less than the current threshold and the voltage of the secondary batteries 30 is more than the voltage threshold), it is determined that the residual capacity RC of the secondary batteries 30 is in the state within the range of approximately 8 Ah or less from the full-charge state, which is close to the full-charge state. Then, it is determined that the SOC region of the secondary batteries 30 is in the full-charge SOC region, which is a region more than 90%, for example.

For example, when the current measured during charge is 62 [A] and the voltage measured during charge is 3.40 [V] (the current of the secondary batteries 30 is more than the current threshold and the voltage of the secondary batteries 30 is less than the voltage threshold), it is determined that the residual capacity RC of the secondary batteries 30 is in a not-full-charge SOC state R11 different from the full-charge state (not in the full-charge state). Then, it is determined that the SOC region of the secondary batteries 30 is in the not-full-charge SOC region of 90% or less, which is different from the full-charge SOC region.

When the current measured during charge is less than the current threshold and the voltage measured during charge is less than the voltage threshold, or when the current measured during charge is more than the current threshold and the voltage measured during charge is more than the voltage threshold; it is impossible to determine which state the OCV is in and to determine the SOC region. In this case, the SOC region (i) R1 is determined as the latest SOC region in the process for determining an SOC.

The process for determining an SOC region of the secondary batteries 30 being discharged will now be explained.

When the current measured by the current measurement unit 80 is less than the current threshold and the voltage measured by the voltage measurement unit 70 is less than the voltage threshold in the secondary batteries 30 being discharged, it is determined that the residual capacity RC of the secondary batteries 30 is in a state close to a discharge-end state and the SOC region of the secondary batteries 30 is in a discharge-end SOC region.

When the current measured by the current measurement unit 80 is more than the current threshold and the voltage measured by the voltage measurement unit 70 is more than the voltage threshold in the secondary batteries 30 being discharged, it is determined that the residual capacity RC of the secondary batteries 30 is not in the discharge-end state and the SOC region of the secondary batteries 30 is in a not-discharge-end SOC region different from the discharge-end SOC region.

Specifically, as shown in FIG. 18, when the current threshold is 55 [A] and the voltage threshold SV is 2.8 [V] in the RC-V2 correlation between the discharging voltage V2 and the residual capacity RC at 0° C., and when the current of the secondary batteries 30 is less than the current threshold and the voltage of the secondary batteries 30 is less than the voltage threshold; it is determined that the residual capacity RC of the secondary batteries 30 is in a state within a range of approximately 13 Ah or less from the discharge-end state, which is close to the discharge-end state R20.

For example, when the current measured during discharge is 54 [A] and the voltage measured during discharge is 2.6 [V] (the current of the secondary batteries 30 is less than the current threshold and the voltage of the secondary batteries 30 is less than the voltage threshold), it is determined that the residual capacity RC of the secondary batteries 30 is in the state within the range of approximately 13 Ah or less from the discharge-end state, which is close to the discharge-end state. Then, it is determined that the SOC region of the secondary batteries 30 is in the discharge-end SOC region, which is a region less than 17%, for example.

For example, when the current measured during discharge is 57 [A] and the voltage measured during discharge is 3.0 [V] (the current of the secondary batteries 30 is more than the current threshold and the voltage of the secondary batteries 30 is more than the voltage threshold), it is determined that the residual capacity RC of the secondary batteries 30 is in a not-discharge-end state R21 different from the discharge-end state (not in the discharge-end state). Then, it is determined that the SOC region of the secondary batteries 30 is in a not-discharge-end SOC region of 17% or more, which is different from the discharge-end SOC region.

When the current measured during discharge is less than the current threshold and the voltage measured during discharge is more than the voltage threshold, or when the current measured during discharge is more than the current threshold and the voltage measured during charge is less than the voltage threshold; it is impossible to determine which state the OCV is in and to determine the SOC region. In this case, the SOC region (i) R1 is determined as the latest SOC region in the process for determining an SOC.

According to this embodiment, the SOC region of the secondary batteries 30 is determined based on the RC-V1 correlation between the charging voltage V1 and the residual capacity RC with reference to the current threshold and the voltage threshold. Therefore, it is determined whether the SOC region of the secondary batteries 30 is in the full-charge SOC region or the not-full-charge SOC region simply by measuring a current and a voltage during charge.

In the case of the secondary batteries 30 being discharged, it is determined whether the SOC region of the secondary batteries 30 is in the discharge-end SOC region or the not-discharge-end SOC region simply by measuring a current and a voltage during discharge and with reference to the current threshold and the voltage threshold.

When it is possible to determine whether the SOC region is in the full-charge SOC region, the not-full-charge SOC region, the discharge-end SOC region, or the not-discharge-end SOC region; the SOC estimation error is eliminated and the SOC estimation accuracy is improved.

Other Embodiments

The techniques disclosed in this description are not limited to the embodiments described above or shown in the drawings, and include various embodiments described below, for example.

(1) In the above embodiments, the lithium ion secondary batteries with an iron phosphate positive active material are illustrated as an example of the energy storage device. Alternatively, the energy storage device may be a secondary battery other than a lithium ion secondary battery or an electrochemical cell with electrochemical phenomena such as a capacitor. The energy storage device should preferably have a flat-voltage region in the SOC-V correlation. The energy storage device may have one, two, three or more flat-voltage regions.

(2) In the above embodiments, the CPU 61 is illustrated as an example of the control unit 60. Alternatively, the control unit may be a structure with a plurality of CPUs, a hard circuit such as an application specific integrated circuit (ASIC), a microcomputer, an FPGA, an MPU, or a structure combining some of these. The control unit may be any structure as long as the alternative structure determines an SOC using a software or a hard circuit.

(3) In the above embodiments, a measured OCV is used for determining which region the OCV of the secondary batteries 30 is in the SOC-OCV correlation. Alternatively, a measured OCV may be used for determining an SOC, and then the SOC is used for determining the region.

(4) In the above embodiments, the process for estimating an SOC includes the current integration method using a measured current value I as a first method, and the voltage reference method (the OCV method) using a voltage and a current measured during charge or discharge as a second method. Alternatively, the first method may be a time integration method in the case a current value is regarded as a constant value, and the second method may be an OCV method using a Kalman filter.

(5) In the above embodiments, the latest SOC region R3 is determined based on the two SOC regions, that is, the SOC region (i) R1 and the SOC region (v) R2. Alternatively, the two SOC regions may be used for determining an SOC region, and another SOC region may be calculated by another method. Based on the latter two SOC regions, the latest SOC region may be estimated.

(6) In the above embodiments, two SOC regions are determined, and the overlapped region of the two SOC regions is determined as the latest SOC region R3. Alternatively, another SOC region different from the two SOC regions may be specified, and the SOC region may be specified by specifying the region different from the two SOC regions.

(7) In the above embodiments, a technique according to the present invention is applied to the SOC estimation of the energy storage device mounted in an automobile. Alternatively, the present invention may be applied to the SOC estimation of the energy storage device mounted in a two-wheeled vehicle, a railway vehicle, an uninterruptible power system, a regenerated-energy receiving apparatus, an energy storage apparatus for generating natural energy, and the like. Part or all of the functions of the energy storage device management apparatus may be installed remotely and connected to the energy storage device or the battery module (the energy storage apparatus) via a network. The energy storage device management apparatus may be installed as a server on a network.

DESCRIPTION OF REFERENCE SIGNS

10: Automobile (Example of Vehicle)
12: Vehicle Load
13: Vehicle Electronic Control Unit
20: Battery Module (Example of Energy Storage Device Module)
30: Secondary Batteries (Example of Energy Storage Device)
50: Battery Management Unit (Example of Energy Storage Device Management Apparatus)
61: Central Processing Unit (Example of Information Processing Unit)
63: Memory
70: Voltage Measurement Unit
80: Current Measurement Unit
R1: SOC Region (i) (Example of First SOC Region)
R2: SOC Region (v) (Example of Second SOC Region)
R3: SOC Region

The invention claimed is:

1. An energy storage device management apparatus configured to determine an SOC region that indicates a state of charge of an energy storage device, the apparatus comprising:
an information processor which determines the SOC region based on a first SOC region, which is determined by a first method, and a second SOC region, which is determined by a second method different than the first method when the first SOC region is determined,
wherein:
the information processor determines whether the first SOC region and the second SOC region overlap one another or not, and, when the first SOC region and the second SOC region overlap, determines an overlapped region in which the first SOC region and the second SOC region overlap as the SOC region; and
the SOC region, the first SOC region, and the second SOC region are all data in a range.

2. The energy storage device management apparatus according to claim 1, wherein:
the first method determines the first SOC region based on a state from a previous SOC region with time of the energy storage device,
the second method determines the second SOC region based on a state of the energy storage device when the first SOC region is determined, and
the second SOC region is determined as the SOC region when the first SOC region and the second SOC region do not overlap.

3. The energy storage device management apparatus according to claim 2, wherein:
the first SOC region is determined by time-integration of a current that flows through the energy storage device, and
the second SOC region is determined by an SOC-V correlation of the energy storage device and a voltage of the energy storage device.

4. The energy storage device management apparatus according to claim 1, wherein the information processor determines the second SOC region based on an SOC-OCV correlation which is a correlation between a state of charge and an open circuit voltage of the energy storage device in a non-energization state.

5. The energy storage device management apparatus according to claim 4, wherein the information processor determines the second SOC region based on an SOC-OCV correlation of the energy storage device after being charged and an SOC-OCV correlation of the energy storage device after being discharged.

6. The energy storage device management apparatus according to claim 1, wherein:
the information processor determines the second SOC region based on a C-V correlation which is a correlation between a residual capacity and a charging voltage of the energy storage device during charge, and
the information processor determines the second SOC region as a full-charge SOC region, which is a state close to a full-charge state of the energy storage device, when a charging current is less than a predetermined current value and the charging voltage is more than a predetermined voltage value.

7. The energy storage device management apparatus according to claim 6, wherein the information processor determines the second SOC region as a not-full-charge SOC region, which is a region different from the full-charge SOC region, when the charging current is more than the predetermined current value and the charging voltage is less than the predetermined voltage value.

8. The energy storage device management apparatus according to claim 1, wherein:
the information processor determines the second SOC region based on a C-V correlation which is a correlation between a residual capacity and a discharging voltage of the energy storage device during discharge, and
the information processor determines the second SOC region as a discharge-end SOC region, which is a state close to a discharge-end state of the energy storage device, when a discharging current is less than a predetermined current value and a discharging voltage is less than a predetermined voltage value.

9. The energy storage device management apparatus according to claim 8, wherein the information processor determines the second SOC region as a not-discharge-end SOC region, which is a region different from the discharge-end SOC region, when the discharging current is more than the predetermined current value and the discharging voltage is more than the predetermined voltage value.

10. The energy storage device management apparatus according to claim 1, wherein:
the information processor sections the state of charge of the energy storage device into plural SOC regions, the SOC region, of which a voltage variation relative to an SOC variation is smaller than that of another SOC region, being a small-variation region, and
the energy storage device is charged or discharged when the first SOC region is in the small-variation region for a predetermined time, and the second SOC region is made to be a region different from the first SOC region.

11. The energy storage device management apparatus according to claim 10, wherein the information processor changes the second SOC region as to be in a region different from a small-variation region in which the second SOC region currently is.

12. An energy storage device module comprising:
an energy storage device;
a current measurement unit which detects a current that flows through the energy storage device;

a voltage measurement unit which detects a voltage of the energy storage device;
a memory which records information on a correlation between a voltage and an SOC of the energy storage device; and
the energy storage device management apparatus according to claim 1.

13. A vehicle comprising:
the energy storage device module according to claim 12;
a vehicle load supplied with electric power from the energy storage device module; and
a vehicle electronic control unit which controls the vehicle load and is capable of communicating with the energy storage device module.

14. An energy storage device management method which determines an SOC estimation value that is a value indicating a state of charge of an energy storage device, the method comprising:
determining a first SOC region by a first method and a second SOC region by a second SOC method different than the first method;
determining whether the first SOC region and the second SOC region overlap one another or not; and
when the first SOC region and the second SOC region overlap, determining a SOC region based upon an overlapped region in which the first SOC region and the second SOC region overlap,
wherein
the SOC region, the first SOC region, and the second SOC region are all data in a range.

15. An energy storage device management apparatus configured to determine an SOC region that indicates a state of charge of an energy storage device, the apparatus comprising:
an information processor which determines the SOC region based on a first SOC region, which is determined by a first method, and a second SOC region, which is determined by a second method when the first SOC region is determined,
wherein:
the information processor determines the second SOC region based on a C-V correlation which is a correlation between a residual capacity and a charging voltage of the energy storage device during charge, and
the information processor determines the second SOC region as a full-charge SOC region, which is a state close to a full-charge state of the energy storage device, when a charging current is less than a predetermined current value and the charging voltage is more than a predetermined voltage value.

16. The energy storage device management apparatus according to claim 15, wherein the information processor determines the second SOC region as a not-full-charge SOC region, which is a region different from the full-charge SOC region, when the charging current is more than the predetermined current value and the charging voltage is less than the predetermined voltage value.

17. The energy storage device management apparatus according to claim 15, wherein:
the first method determines the first SOC region based on a state from a previous SOC region with time of the energy storage device,
the second method determines the second SOC region based on a state of the energy storage device when the first SOC region is determined, and
the second SOC region is determined as the SOC region when the first SOC region and the second SOC region do not overlap.

18. An energy storage device management apparatus configured to determine an SOC region that indicates a state of charge of an energy storage device, the apparatus comprising:
an information processor which determines the SOC region based on a first SOC region, which is determined by a first method, and a second SOC region, which is determined by a second method when the first SOC region is determined,
wherein:
the information processor determines the second SOC region based on a C-V correlation which is a correlation between a residual capacity and a discharging voltage of the energy storage device during discharge, and
the information processor determines the second SOC region as a discharge-end SOC region, which is a state close to a discharge-end state of the energy storage device, when a discharging current is less than a predetermined current value and a discharging voltage is less than a predetermined voltage value.

19. The energy storage device management apparatus according to claim 18, wherein the information processor determines the second SOC region as a not-discharge-end SOC region, which is a region different from the discharge-end SOC region, when the discharging current is more than the predetermined current value and the discharging voltage is more than the predetermined voltage value.

20. The energy storage device management apparatus according to claim 18, wherein:
the first method determines the first SOC region based on a state from a previous SOC region with time of the energy storage device,
the second method determines the second SOC region based on a state of the energy storage device when the first SOC region is determined, and
the second SOC region is determined as the SOC region when the first SOC region and the second SOC region do not overlap.

* * * * *